(12) United States Patent
Itou

(10) Patent No.: US 11,817,038 B2
(45) Date of Patent: Nov. 14, 2023

(54) DISPLAY SYSTEM

(71) Applicant: Japan Display Inc., Tokyo (JP)

(72) Inventor: Osamu Itou, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/592,557

(22) Filed: Feb. 4, 2022

(65) Prior Publication Data

US 2022/0157228 A1    May 19, 2022

Related U.S. Application Data

(63) Continuation of application No. PCT/JP2020/029295, filed on Jul. 30, 2020.

(30) Foreign Application Priority Data

Sep. 4, 2019    (JP) .................................. 2019-161438

(51) Int. Cl.
*G09G 3/32*        (2016.01)
*H01L 27/15*       (2006.01)

(52) U.S. Cl.
CPC .............. *G09G 3/32* (2013.01); *H01L 27/156* (2013.01); *G09G 2300/02* (2013.01); *G09G 2320/0626* (2013.01)

(58) Field of Classification Search
CPC .............. G09G 3/32; G09G 2320/0626; G09G 2300/0426; G09G 2310/08;
(Continued)

(56) References Cited

U.S. PATENT DOCUMENTS

2012/0135661 A1*  5/2012  Imanishi ........... G02F 1/133723
                                                          252/182.28
2012/0139956 A1   6/2012  Joseph et al.
(Continued)

FOREIGN PATENT DOCUMENTS

CN        205881355 U       1/2017
JP        2010-026070 A     2/2010
(Continued)

OTHER PUBLICATIONS

International Search Report dated Sep. 8, 2020 in PCT/JP2020/029295 filed on Jul. 30, 2020, 2 pages.
(Continued)

*Primary Examiner* — Muhammad N Edun
(74) *Attorney, Agent, or Firm* — Maier & Maier, PLLC

(57) ABSTRACT

To make a display device inconspicuous. A display system includes a base and a display device attached to the base. The display device includes a plurality of inorganic light emitters arrayed in a matrix with a row-column configuration and a surface layer. The surface layer is provided in a traveling direction of light emitted from the inorganic light emitters with respect to the inorganic light emitters and includes a plurality of transmission parts and a blocking part. The transmission parts are provided in a matrix with a row-column configuration so as to overlap the inorganic light emitters when viewed from the traveling direction of the light and allow the light from the inorganic light emitters to pass therethrough. The blocking part blocks the light from the inorganic light emitters. The inorganic light emitters are provided overlapping the transmission parts provided to the surface layer.

7 Claims, 20 Drawing Sheets

(58) Field of Classification Search
CPC .......... G09G 2320/045; G09G 2300/02; H01L 27/156; H01L 25/0753; H01L 25/167; H01L 33/58; G09F 9/30; G09F 9/00; G09F 9/33; E04F 13/08
See application file for complete search history.

(56) References Cited

U.S. PATENT DOCUMENTS

| | | | |
|---|---|---|---|
| 2016/0266695 A1* | 9/2016 | Bae | G06V 40/1318 |
| 2017/0068130 A1* | 3/2017 | Chen | G02F 1/133377 |
| 2018/0101712 A1* | 4/2018 | Tsai | G06F 3/0416 |
| 2019/0377210 A1* | 12/2019 | Chikama | G02F 1/133512 |
| 2020/0241675 A1 | 7/2020 | Oki et al. | |

FOREIGN PATENT DOCUMENTS

| | | |
|---|---|---|
| JP | 2012-118513 A | 6/2012 |
| JP | 6370519 B1 | 8/2018 |

OTHER PUBLICATIONS

Taiwanese Office Action dated Apr. 15, 2021 in Taiwanese Patent Application No. 109127204, 14 pages (with English Machine Translation).
Office Action dated Jul. 4, 2023, in corresponding Japanese Application No. 2019-161438, 6 pages.

* cited by examiner

FIG.1
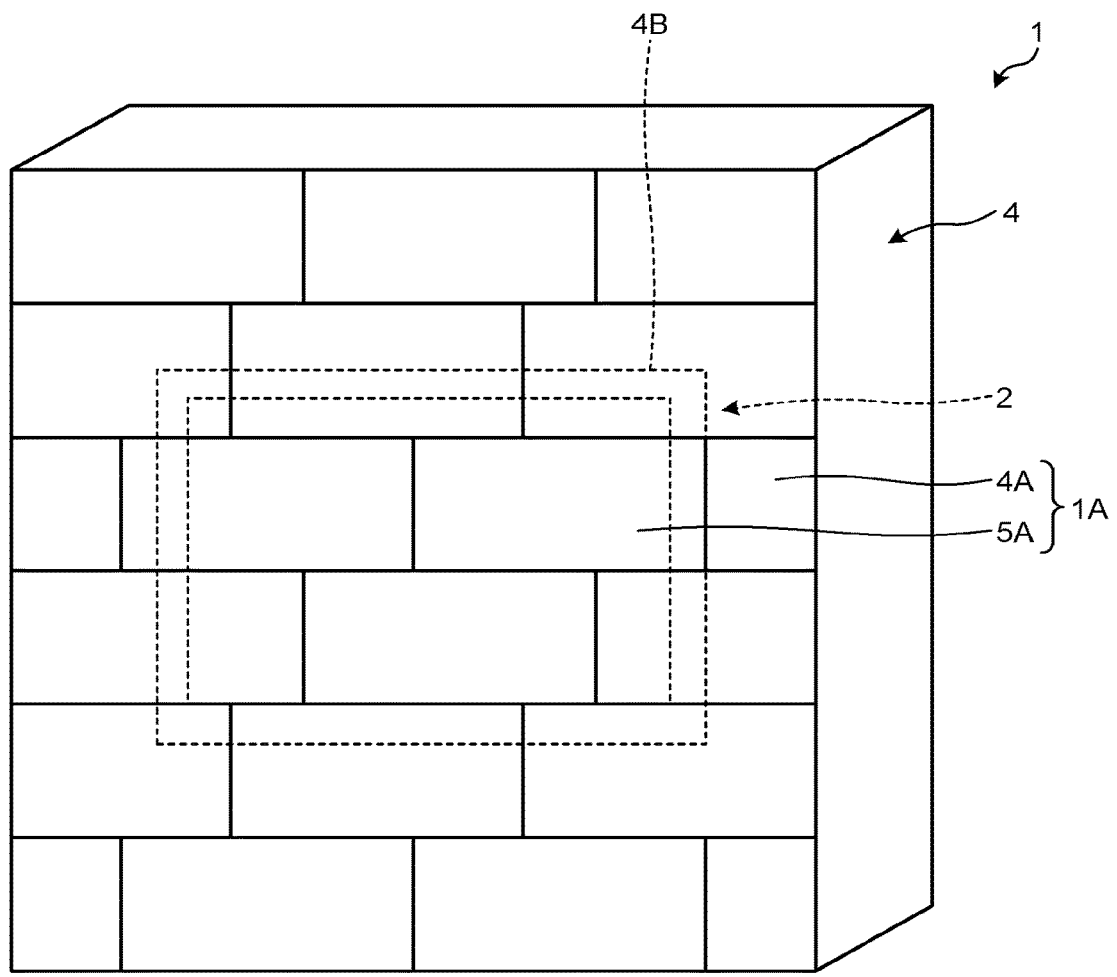
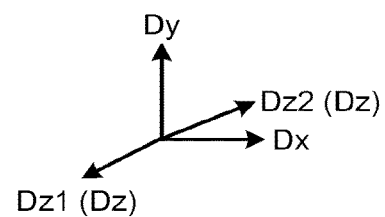

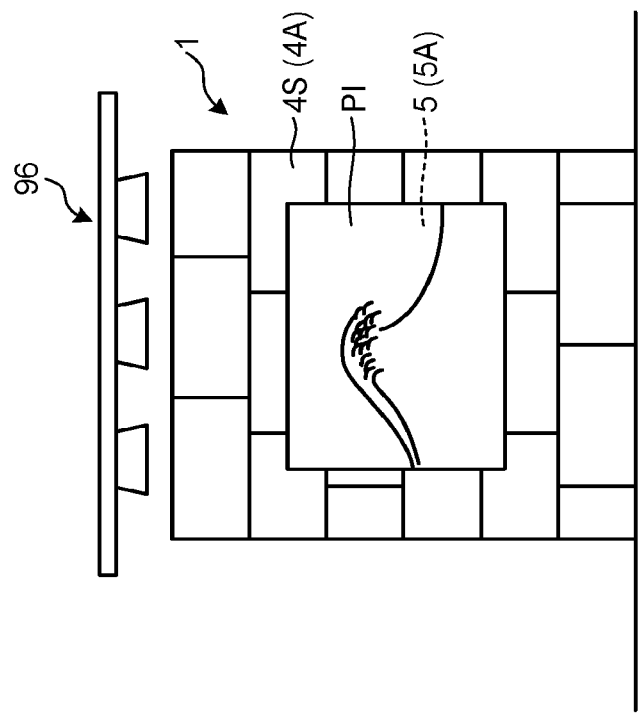
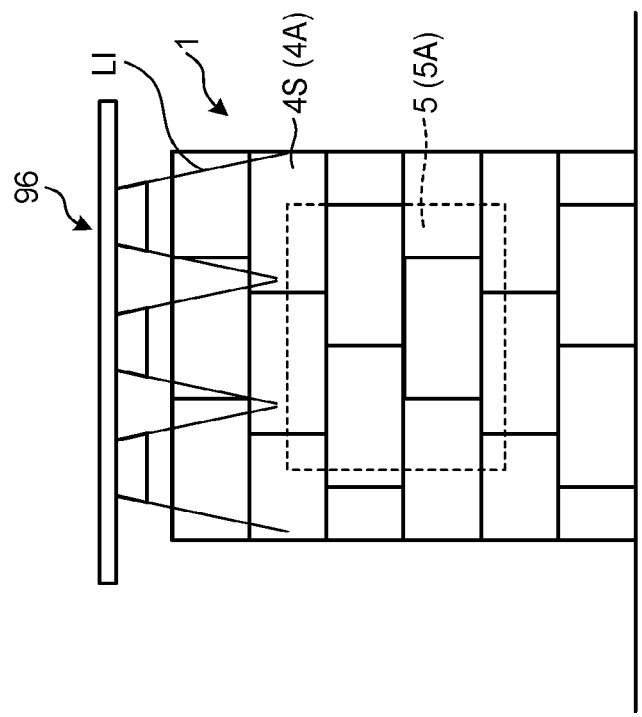
FIG.15A
FIG.15B

DISPLAY SYSTEM

CROSS-REFERENCE TO RELATED APPLICATION(S)

This application is a continuation of PCT international application Ser. No. PCT/JP2020/029295 filed on Jul. 30, 2020 which designates the United States, incorporated herein by reference, and which claims the benefit of priority from Japanese Patent Application No. 2019-161438, filed on Sep. 4, 2019, incorporated herein by reference.

BACKGROUND

1. Technical Field

The present disclosure relates to a display system.

2. Description of the Related Art

Display devices have recently been increasing in size. Installing such a display device in a home or the like may possibly reduce living space or make the display device conspicuous. Japanese Patent Application Laid-open Publication No. 2010-26070 (JP-A-2010-26070), for example, describes a technique for placing a display device on a wall. Placing a display device on a wall can suppress reduction in living space.

In JP-A-2010-26070, however, has room for improvement in making the display device inconspicuous.

In view of the disadvantages described above, an object of the present disclosure is to provide a display system that can make a display system inconspicuous.

SUMMARY

A display system according to an embodiment of the present disclosure comprising a base and a display device attached to the base, wherein the display device comprises: a plurality of inorganic light emitters arrayed in a matrix with a row-column configuration; and a surface layer provided in a traveling direction of light emitted from the inorganic light emitters with respect to the inorganic light emitters and comprising a plurality of transmission parts and a blocking part, the transmission parts being provided in a matrix with a row-column configuration so as to overlap the inorganic light emitters when viewed from the traveling direction of the light and allowing the light from the inorganic light emitters to pass therethrough, the blocking part blocking the light from the inorganic light emitters, and the inorganic light emitters are provided overlapping the transmission parts provided to the surface layer.

BRIEF DESCRIPTION OF THE DRAWINGS

FIG. 1 is a schematic of a display system according to the present embodiment.

FIG. 14 is a schematic for illustrating an external appearance of the display system when the inorganic light emitters are turned on.

FIG. 15A is a schematic of a display system according to a first modification.

FIG. 15B is a schematic of a display system according to a first modification.

DETAILED DESCRIPTION OF THE PREFERRED EMBODIMENTS

Figure 2:
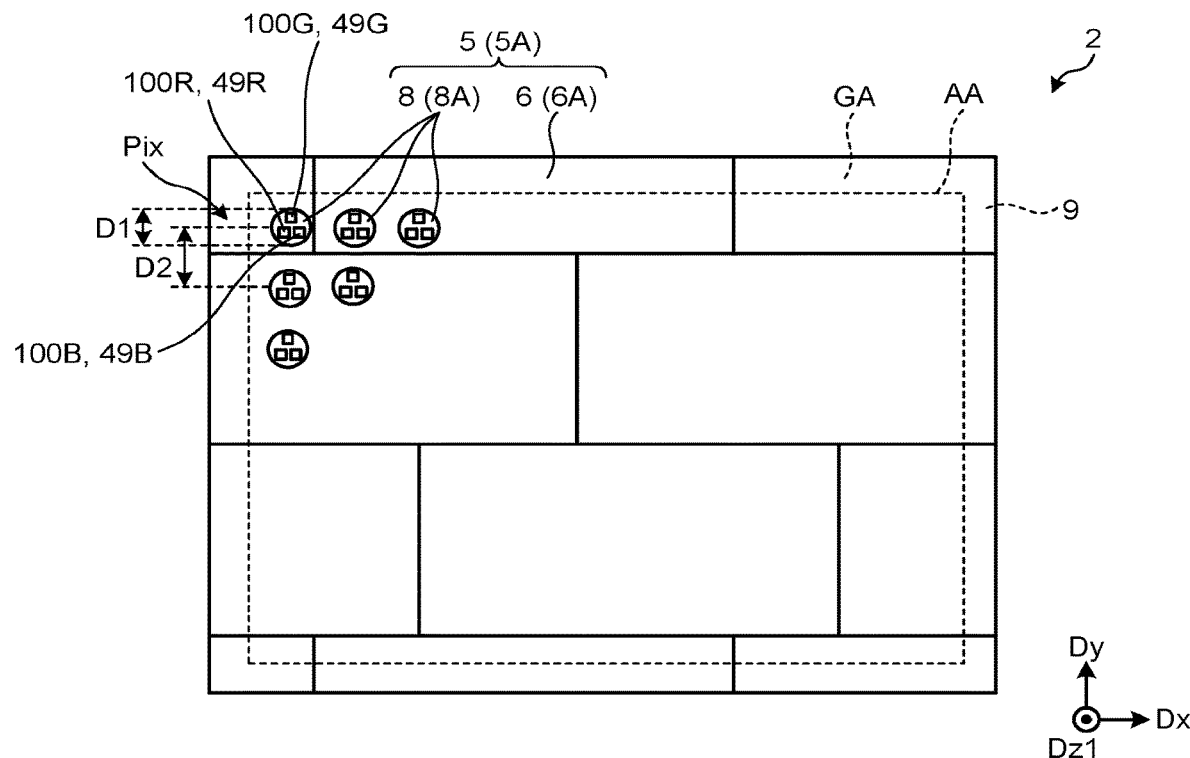
FIG. 2 is a schematic plan view of a display device according to the present embodiment.

Embodiment of the present disclosure is described below with reference to the accompanying drawings. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

(Entire Configuration of the Display System)

FIG. 1 is a schematic of a display system according to the present embodiment. As illustrated in FIG. 1, a display system 1 according to the present embodiment includes a display device 2 and a base 4. The base 4 is a structure, such as a wall and a pillar. The display device 2 is attached to the base 4 and displays an image. More specifically, the display device 2 is embedded in a recess 4B that is a recessed portion formed on a surface of the base 4. While the base 4 according to the present embodiment is a structure, such as a wall and a pillar, it may be any desired object. The base 4 may be a small object, such as a cover of a datebook. While the display device 2 is a large display device having a diagonal length of approximately 85 inches, for example, the size is not limited thereto, and the display device 2 may have any desired size. The display device 2 may be a small display device.

The display device 2 is attached to the base 4 such that a surface 5A is exposed to the outside and is parallel to a surface 4A of the base 4, and more specifically, such that the surface 5A and the surface 4A of the base 4 are at the same position in a third direction Dz, which will be described later. More specifically, the display system 1 is attached to the base 4 such that the surface 5A of the display device 2 and the surface 4A of the base 4 continuously extend, that is, such that the surface 5A and the surface 4A constitute a single continuous surface 1A.

In the following description, one direction parallel to the surface 5A is referred to as a first direction Dx, and another direction parallel to the surface 5A is referred to as a second direction Dy. While the first direction Dx is orthogonal to the second direction Dy, it may intersect the second direction Dy without being orthogonal thereto. A direction orthogonal to the first direction Dx and the second direction Dy, that is, a direction orthogonal to the surface 5A is referred to as the third direction Dz. The third direction Dz, for example, corresponds to the normal direction of a substrate 10, which will be described later. In the following description, planar view indicates the positional relation viewed from the third direction Dz. One direction out of directions parallel to the third direction Dz is referred to as a direction Dz1, and the other direction out of the directions parallel to the third direction Dz, that is, the direction opposite to the direction Dz1 is referred to as a direction Dz2. The direction Dz1 is a direction extending from an array substrate 9, which will be described later, toward the surface 5A.

(Configuration of the Display Device)

Figure 3:
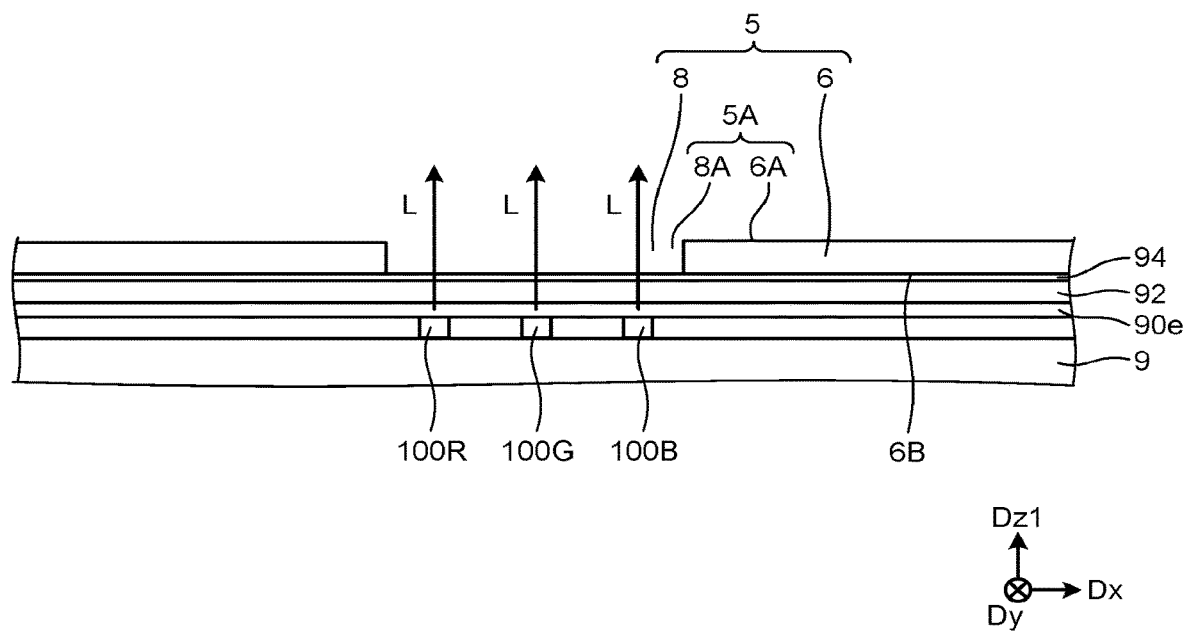
FIG. 3 is a schematic partial sectional view of the display device according to the present embodiment.

FIG. 2 is a schematic plan view of the display device according to the present embodiment, and FIG. 3 is a schematic partial sectional view of the display device according to the present embodiment. As illustrated in FIGS. 2 and 3, the display device 2 includes the array substrate 9, a plurality of inorganic light emitters 100, and a surface layer 5. The array substrate 9 is a drive circuit substrate that drives pixels Pix of the display device 2 and is also called a backplane or an active matrix substrate. The array substrate 9 includes a plurality of transistors, a plurality of capacitances, various kinds of wiring, and other components, which will be described later in greater detail. As illustrated in FIGS. 2 and 3, the inorganic light emitters 100 are provided in the Dz1 direction with respect to the array substrate 9 and are arrayed in a matrix with a row-column configuration. In other words, the inorganic light emitters 100 are arrayed in the first direction Dx and the second direction Dy in the Dz1 direction with respect to the array substrate 9. The inorganic light emitters 100 are inorganic light emitting diodes (LEDs) and emit light L toward the direction Dz1. The inorganic light emitters 100 emit the light L not only along the direction Dz1 because they emit the light L at a spread angle. The inorganic light emitter 100 is an inorganic light emitting diode chip having a size of approximately several micrometers to 300 micrometers in planar view. Typically, a light emitting diode having a chip size of 100 micrometers or larger is called a mini LED, and a light emitting diode having a chip size of several micrometers to smaller than 100 micrometers is called a micro LED. The present disclosure can use LEDs having any size and may choose the size depending on the screen size (size of one pixel) of the display device. A display device including micro LEDs in respective pixels is also called a micro LED display device. The term "micro" of the micro LED is not intended to limit the size of the inorganic light emitter 100.

The display device 2 includes a first inorganic light emitter 100R, a second inorganic light emitter 100G, and a third inorganic light emitter 100B as the inorganic light emitters 100. The first inorganic light emitter 100R emits a primary color of red as the first color and constitutes a pixel 49R that displays the first color. The second inorganic light emitter 100G emits a primary color of green as the second color and constitutes a pixel 49G that displays the second color. The third inorganic light emitter 100B emits a primary color of blue as the third color and constitutes a pixel 49B that displays the third color. One first inorganic light emitter 100R, one second inorganic light emitter 100G, and one third inorganic light emitter 100B make a group, that is, the pixels 49R, 49G, and 49B make a group and constitute one pixel Pix. In the display device 2, the pixels Pix are arrayed in a matrix with a row-column configuration, that is, in the first direction Dx and the second direction Dy in planar view. In one pixel Pix, the first inorganic light emitter 100R (first pixel 49R) and the third inorganic light emitter 100B (third pixel 49B) are disposed side by side in the first direction Dx. The second inorganic light emitter 100G (second pixel 49G) is positioned in the second direction Dy with respect to the first inorganic light emitter 100R and the third inorganic light emitter 100B. In the example according to the present embodiment, the first inorganic light emitter 100R is disposed at the position of a first vertex of an equilateral triangle in planar view. The second inorganic light emitter 100G is disposed at the position of a second vertex. The third inorganic light emitter 100B is disposed at the position of a third vertex. The order of the first inorganic light emitter 100R, the second inorganic light emitter 100G, and the third inorganic light emitter 100B in one pixel Pix is not limited thereto and may be any desired order.

The first color, the second color, and the third color are not limited to red, green, and blue, respectively, and may be any desired colors, such as complementary colors. The number of pixels included in the pixel Pix is not limited to three, and four or more pixels may be included in the pixel Pix. The pixel Pix may include a pixel 49W that displays white as the fourth color, for example. In this case, the pixel 49W includes an inorganic light emitter 100 that emits light in the fourth color.

As illustrated in FIG. 3, the surface layer 5 is provided in the direction Dz1 (in a traveling direction of the light L emitted from the inorganic light emitters 100) with respect to the inorganic light emitters 100. The surface layer 5 includes a blocking part 6 and a transmission part 8. The blocking part 6 is a layer that blocks the light L that is visible light from the inorganic light emitters 100. In other words, the blocking part 6 is a layer that does not allow the light L to pass therethrough. The transmission part 8 is provided penetrating from the surface of the surface layer 5 in the direction Dz2 to the surface in the direction Dz1. The transmission part 8 does not block the light L and allows it to pass therethrough. The transmission part 8 according to the present embodiment is an opening (hole) formed from the surface of the surface layer 5 in the direction Dz2 to the surface in the direction Dz1. The transmission part 8 is not limited to the opening, that is, a space, and it may be a solid member that allows the light L to pass therethrough, for example. A plurality of transmission parts 8 are provided and arrayed in a matrix with a row-column configuration, that is, in the first direction Dz and the second direction Dy. In the surface layer 5, it can be said that the transmission parts 8 are provided and arrayed in a matrix with a row-column configuration, and the blocking part 6 is provided at a position not provided with the transmission parts 8 in planar view.

The transmission part 8 is provided at a position overlapping the inorganic light emitters 100 (the first inorganic light emitter 100R, the second inorganic light emitter 100G, and the third inorganic light emitter 100B) in planar view. The blocking part 6 is provided at a position not overlapping the inorganic light emitters 100 (the first inorganic light emitter 100R, the second inorganic light emitter 100G, and the third inorganic light emitter 100B) in planar view. The transmission parts 8 according to the present embodiment are each provided for one pixel Pix. In other words, the inorganic light emitters 100 are provided overlapping the transmission parts 8 provided in the surface layer 5. Consequently, the transmission parts 8 according to the present embodiment are provided for respective groups of the first inorganic light emitter 100R, the second inorganic light emitter 100G, and the third inorganic light emitter 100B and each overlap one group of the first inorganic light emitter 100R, the second inorganic light emitter 100G, and the third inorganic light emitter 100B. The transmission parts 8 are not necessarily provided for respective groups of the first inorganic light emitter 100R, the second inorganic light emitter 100G, and the third inorganic light emitter 100B. The transmission parts 8, for example, may be provided for the respective inorganic light emitters 100 and each overlap one inorganic light emitter 100 in planar view.

The area of the transmission parts 8 in planar view is smaller than that of the blocking part 6 in planar view. If the area of the transmission parts 8 in planar view is 10% or lower of the area of the surface layer 5, that is, the whole area including the blocking part 6 and the transmission parts 8 in planar view, for example, the transmission parts 8 are hard to recognize by devising the pattern on the surface of the blocking part 6. If the area of the transmission parts 8 in planar view is 1% or lower, for example, the transmission parts 8 are hard to recognize regardless of the pattern on the surface of the blocking part 6, and herein the area of the transmission parts 8 is approximately 3%, for example. It can be said that the transmission parts 8 are sufficiently small with respect to the whole blocking part 6. A length D1 is the width of the transmission part 8 in planar view. While the length D1 is the length of the transmission part 8 in the direction Dy in FIG. 2, it may be a length of the transmission part 8 in the direction Dx. A length D2 is a pitch between the transmission parts 8 disposed side by side in planar view. The length D2 can be said the length of a line connecting the center points of the transmission parts 8 disposed side by side. In FIG. 2, while the length D2 is the length of a line connecting the center points of the transmission parts 8 disposed side by side in the direction Dy, it may be a length of a line connecting the center points of the transmission parts 8 disposed side by side in the direction Dx. In FIG. 3, the length D1 in the direction Dx is substantially equal to the length D1 in the direction Dy, and the length D2 in the direction Dx is substantially equal to the length D2 in the direction Dy. In terms of the area ratio described above, if the length D1 is 31% or lower with respect to the length D2, for example, the transmission parts 8 are hard to recognize by devising the pattern on the surface of the blocking part 6. If the length D1 is 1% or lower with respect to the length D2, the transmission parts 8 are hard to recognize regardless of the pattern on the surface of the blocking part 6. FIG. 3 is a schematic view, however, the length D1 is approximately 17% of the length D2, and thus it can be said that the pitch between the transmission parts 8 is sufficiently large with respect to the size of the transmission part 8. As described above, the area of the transmission parts 8 is small, and the pitch between the transmission parts 8 is large. Therefore, when a person visually recognizes the surface of the surface layer 5, the transmission parts 8 are hard to visually recognize, and a surface 6A of the blocking part 6 is visually recognized as a continuous surface on a plane.

The blocking part 6 is formed such that the external appearance of the surface 6A is associated with the external appearance of the surface 4A of the base 4. The state where the external appearances are associated with each other means that the external appearances are the same or similar. The state may mean that the external appearances are so similar that they cannot be distinguished from each other when a person visually recognizes the surface 6A of the blocking part 6 and the surface 4A of the base 4, for example. The external appearance according to the present embodiment indicates at least one of shape, pattern, and color. In other words, it can be said that the surface 6A of the blocking part 6 and the surface 4A of the base 4 are associated with each other in at least one of shape, pattern, and color. More specifically, in the present embodiment, it is preferable that the surface 6A of the blocking part 6 and the surface 4A of the base 4 be the same in at least one of shape, pattern, and color. In the base 4 and the blocking part 6, it is preferable that the reflectance of visible light on the surface 6A be, for example, 10% or lower especially when a photographic image or the like is displayed because a high contrast ratio can be achieved even the surroundings are bright.

The surface layer 5 in the present embodiment is the farthest layer of the display device 2 in the direction Dz1. Accordingly, the surface of the surface layer 5 in the direction Dz1 corresponds to the surface 5A of the display device 2 in the direction Dz1. The surface 5A includes the surface 6A and a transmission surface 8A. The surface 6A can be said a region provided with the blocking part 6 and is the surface of the blocking part 6. The transmission surface 8A is a region provided with the transmission part 8. The transmission surface 8A can be said a region overlapping the inorganic light emitters 100 (pixel Pix) and the transmission part 8 in planar view. The surface 5A is provided with the transmission surfaces 8A arrayed in a matrix with a row-column configuration in planar view and has the surface 6A formed in the region other than the transmission surfaces 8A. The surface layer 5 of the display device 2 is not limited to the farthest layer in the direction Dz1, and a layer may be provided in the direction Dz1 with respect to the surface layer 5. In the case, the layer provided in the direction Dz1 with respect to the surface layer 5 is a layer that allows visible light to pass therethrough. If the layer is provided in the direction Dz1 with respect to the surface layer 5, the surface of the surface layer 5 in the direction Dz1 is visually recognized as the surface 5A of the display device 2 in the direction Dz1 in planar view. Consequently, if the layer is provided in the direction Dz1 with respect to the surface layer 5, the surface of the surface layer 5 in the direction Dz1 can be called the surface 5A of the display device 2 in the direction Dz1.

When the display device 2 is viewed from the direction Dz1, the transmission surfaces 8A are not visually recognized because the transmission parts 8 are small as described above, and the surface 5A is visually recognized as a surface in which the surface 6A continuously extends. By contrast, when the inorganic light emitters 100 are turned on, the light L from the inorganic light emitters 100 passes through the transmission parts 8 facing the inorganic light emitters 100 in the direction Dz1 and is projected to the outside of the display device 2. In other words, when the inorganic light emitters 100 are turned on, the light L from the inorganic light emitters 100 is projected through the transmission surfaces 8A. When the inorganic light emitters 100 are turned on, an image due to the light L from the inorganic light emitters 100 having passed through the transmission surfaces 8A is visually recognized on the surface 5A in the direction Dz1.

Figure 4:
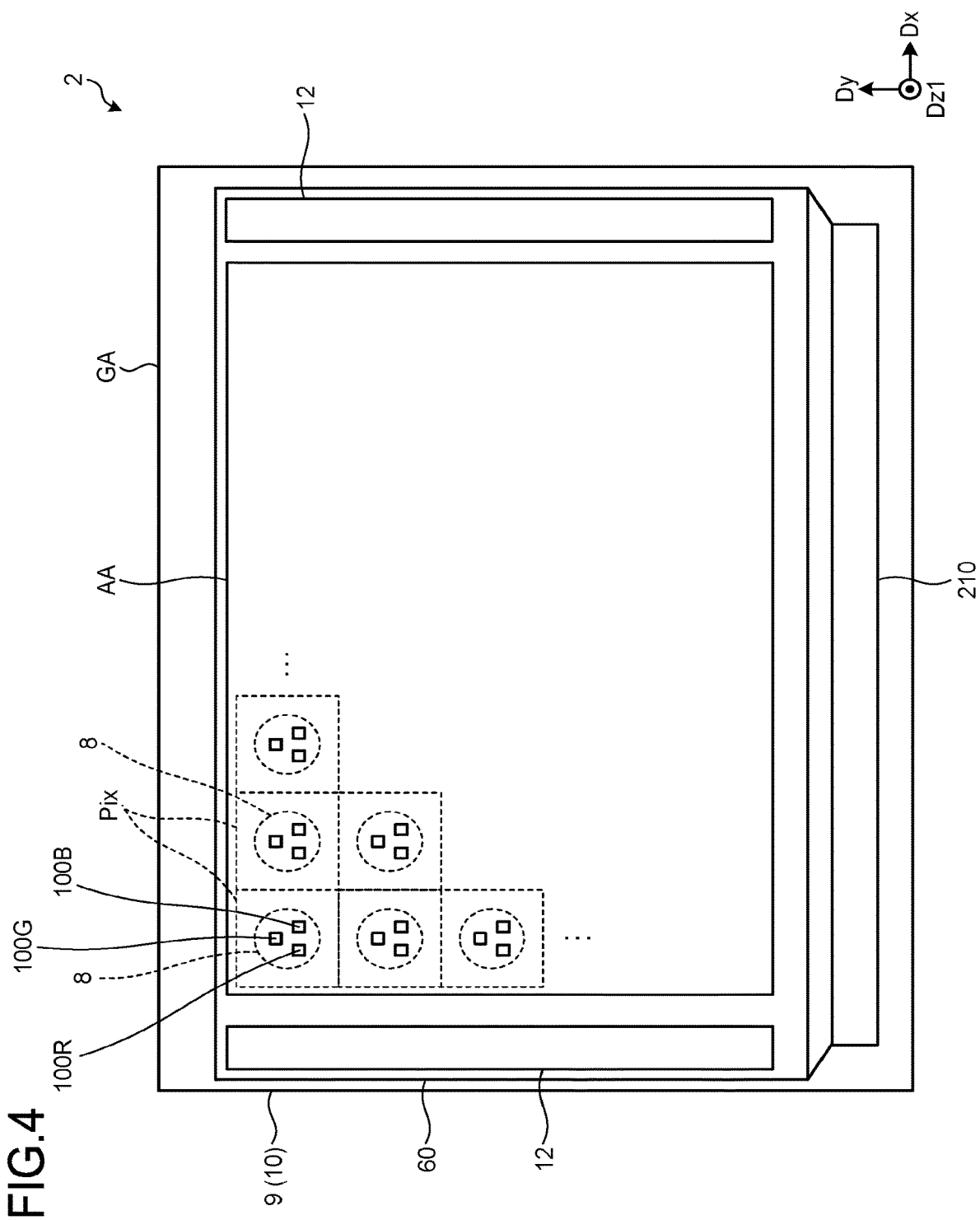
FIG. 4 is a plan view for illustrating an example of the configuration of the display device according to the present embodiment.

The following describes the entire configuration of the display device 2. FIG. 4 is a plan view for illustrating an example of the configuration of the display device according to the present embodiment. As illustrated in FIG. 4, the display device 2 includes the array substrate 9, the pixels Pix, drive circuits 12, a drive integrated circuit (IC) 210, and cathode wiring 60.

As illustrated in FIG. 4, the display device 2 has a display region AA and a peripheral region GA. The display region AA is a region provided with the pixels Pix and displays an image. The peripheral region GA does not overlap the pixels Pix and is positioned outside the display region AA. The pixels Pix are arrayed in the first direction Dx and the second direction Dy in the display region AA of the substrate 10. The surface layer 5 is provided over the whole region of the display device 2 including the display region AA and the peripheral region GA in planar view.

The drive circuits 12 are provided in the peripheral region GA of the substrate 10 included in the array substrate 9. The drive circuits 12 are circuits to drive a plurality of gate lines (e.g., a light emission control scanning line BG, a reset control scanning line RG, an initialization control scanning line IG, and a writing control scanning line SG (refer to FIG. 8)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 2. The drive IC 210 may be mounted in the peripheral region GA of the substrate 10 as chip on glass (COG). The mounting form of the drive IC 210 is not limited thereto, and the drive IC 210 may be mounted on a wiring substrate coupled to the peripheral region GA of the substrate 10 as chip on film (COF). The wiring substrate coupled to the substrate 10 is flexible printed circuits (FPCs) or a rigid substrate, for example.

The cathode wiring 60 is provided in the peripheral region GA of the substrate 10. The cathode wiring 60 is provided surrounding the pixels Pix in the display region AA and the drive circuits 12 in the peripheral region GA. Cathodes (cathode electrodes 114 (refer to FIG. 9)) of a plurality of inorganic light emitters 100 are coupled to the common cathode wiring 60 and are supplied with a fixed potential (e.g., a ground potential). More specifically, the cathode electrode 114 of the inorganic light emitter 100 is coupled to the cathode wiring 60 via a counter cathode electrode 90e on the array substrate 9. A cathode wiring 14 may partially have a slit and be provided as two different wires on the substrate 10.

Figure 5:
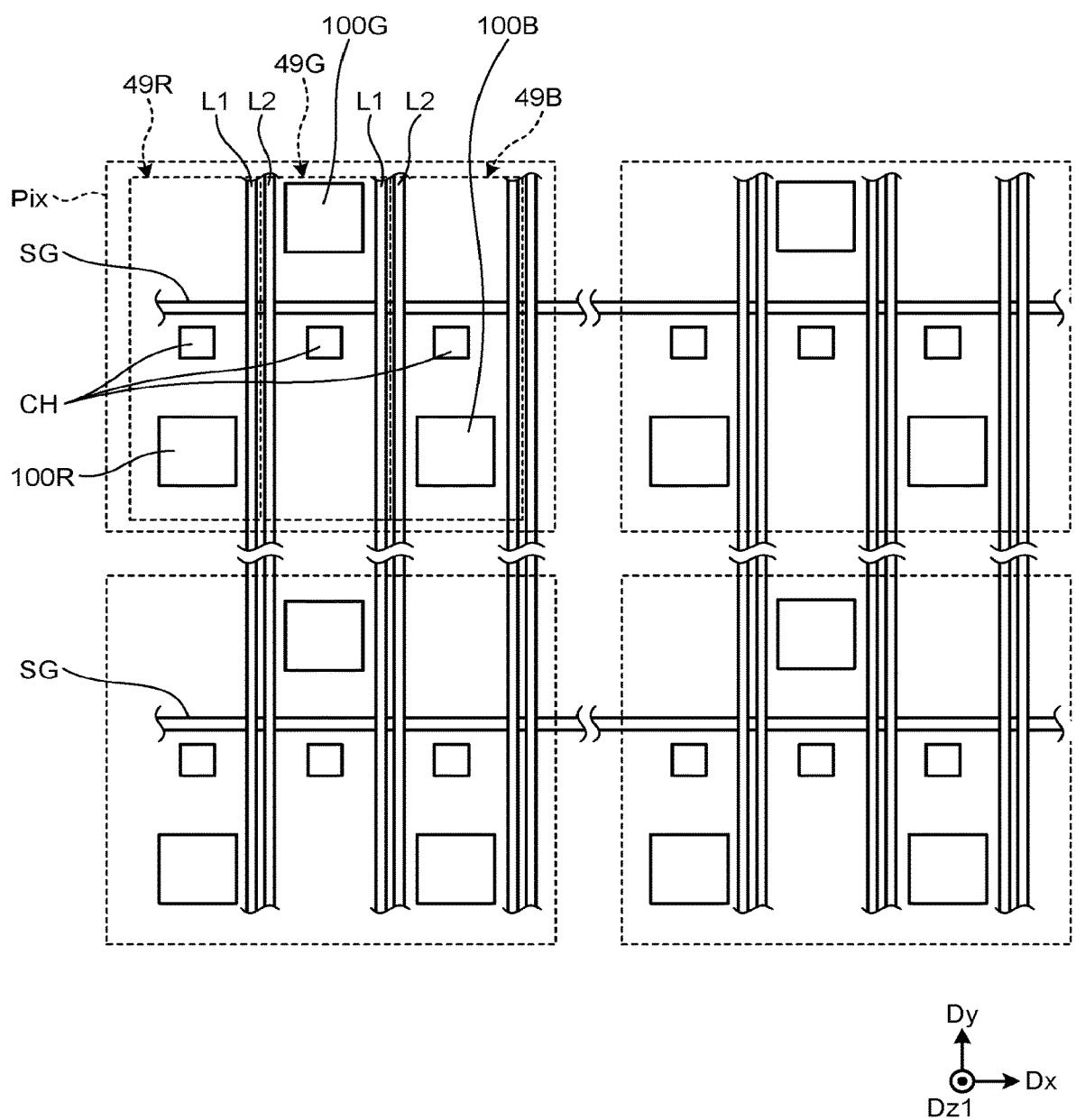
FIG. 5 is a schematic for explaining an example of arrangement of pixels and signal lines according the present embodiment.

FIG. 5 is a schematic for explaining an example of arrangement of the pixels and signal lines according the present embodiment. In the display device 2, as illustrated in FIG. 5, a pair of an anode power supply line (power supply wiring) L1 and a video signal line (signal wiring) L2 extends in the second direction Dy. A plurality of pairs of the anode power supply line L1 and the video signal line L2 are disposed side by side in the first direction Dx. The writing control scanning line (signal scanning wiring) SG extends in the first direction Dx. A plurality of writing control scanning lines SG are disposed side by side in the second direction Dy. A contact hole CH is formed in a region (grid) surrounded by the pairs of the anode power supply line L1 and the video signal line L2 disposed side by side in the first direction Dx and the writing control scanning lines SG disposed side by side in the second direction Dy. A plurality of contact holes CH are formed and arrayed in the first direction Dx and the second direction Dy. The second pixel 49G (second inorganic light emitter 100G) is positioned in the second direction Dy with respect to a row of the contact holes CH formed side by side in the first direction Dx. The first pixel 49R (first inorganic light emitter 100R) and the third pixel 49B (third inorganic light emitter 100B) are positioned in the opposite direction of the second direction Dy with respect to the row of the contact holes CH formed side by side in the first direction Dx.

Figure 6:
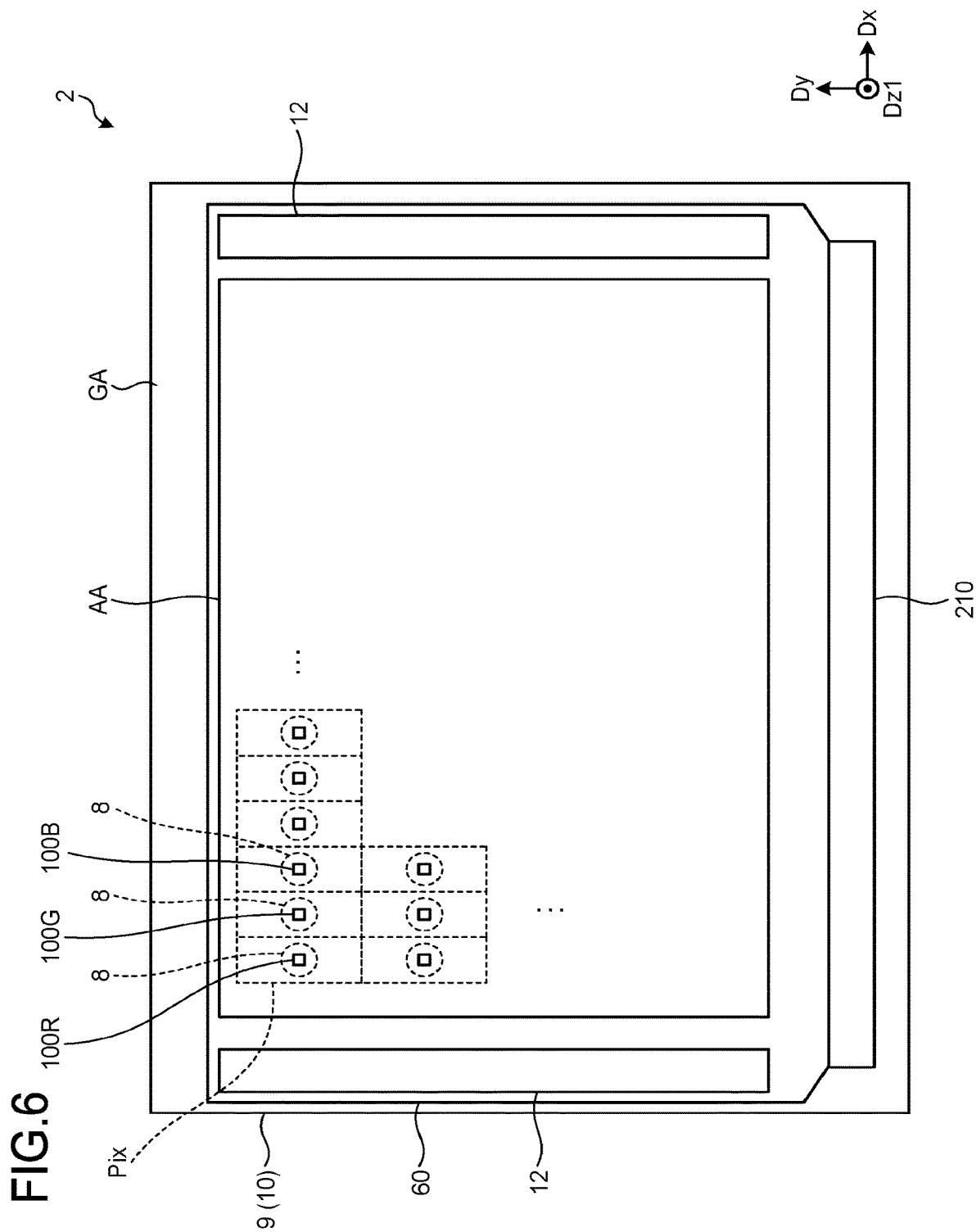
FIG. 6 is a plan view for illustrating another example of the configuration of the display device according to the present embodiment.
Figure 7:
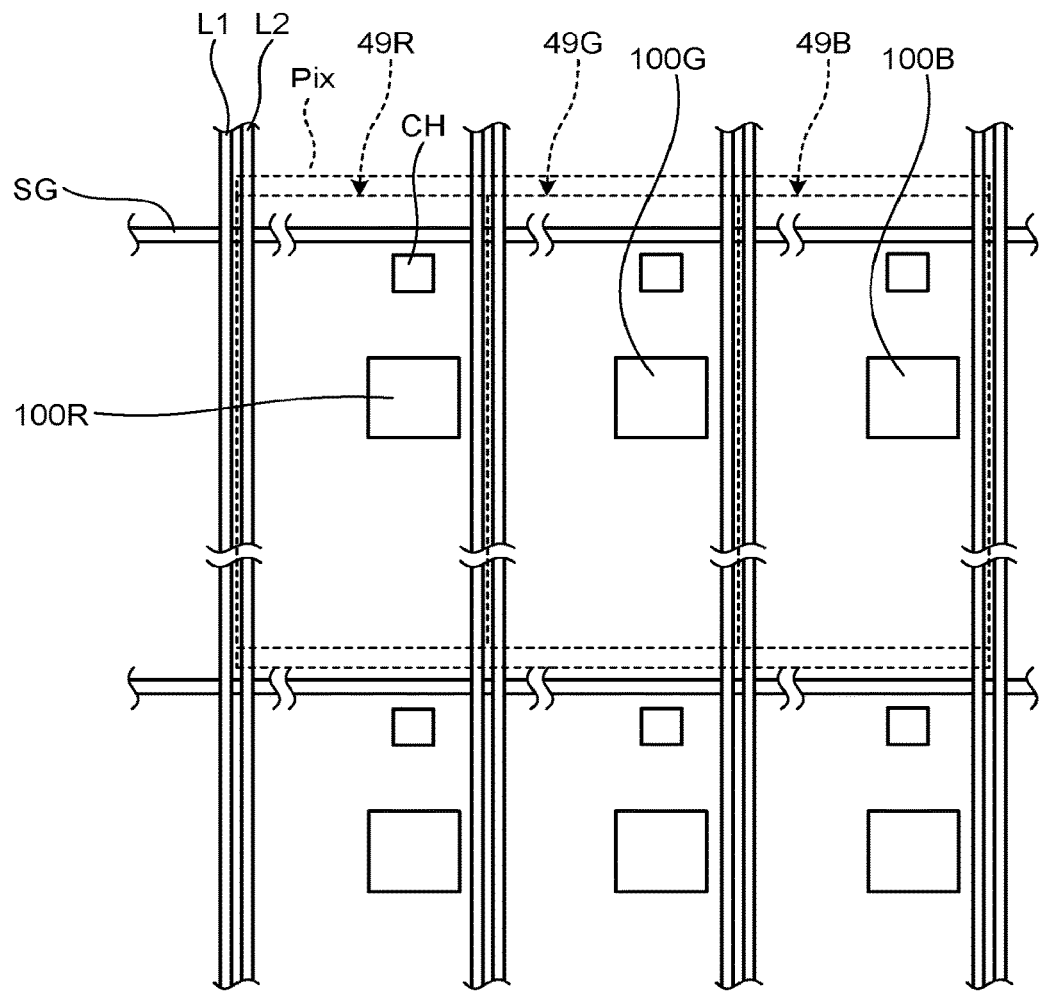
FIG. 7 is a schematic for explaining another example of arrangement of the pixels and the signal lines according the present embodiment.

FIGS. 4 and 5 illustrate an example where the first inorganic light emitter 100R (belonging to the first pixel 49R), the second inorganic light emitter 100G (belonging to the second pixel 49G), and the third inorganic light emitter 100B (belonging to the third pixel 49B) are arrayed in a manner positioned at the respective vertices of a triangle in one pixel Pix. The following describes another example of arrangement with reference to FIGS. 6 and 7. FIG. 6 is a plan view for illustrating another example of the configuration of the display device according to the present embodiment. FIG. 7 is a schematic for explaining another example of arrangement of the pixels and the signal lines according the present embodiment. As illustrated in FIG. 6, the first inorganic light emitter 100R (belonging to the first pixel 49R), the second inorganic light emitter 100G (belonging to the second pixel 49G), and the third inorganic light emitter 100B (belonging to the third pixel 49B) may be disposed side by side in this order, that is, in a stripe pattern in the first direction Dx. The first inorganic light emitter 100R, the second inorganic light emitter 100G, and the third inorganic light emitter 100B may each constitute one pixel Pix. In other words, one inorganic light emitter 100 may constitute one pixel Pix. In this case, the transmission parts 8 are provided for the respective inorganic light emitters 100 and each overlap one inorganic light emitter 100 in planer view. In the case of arrangement in a stripe pattern illustrated in FIG. 7, the first inorganic light emitter 100R (belonging to the first pixel 49R), the second inorganic light emitter 100G (belonging to the second pixel 49G), and the third inorganic light emitter 100B (belonging to the third pixel 49B) are positioned in the second direction Dy with respect to the row of the contact holes CH formed side by side in the first direction Dx. Also in this arrangement in such a strip pattern, one group of the first inorganic light emitter 100R, the second inorganic light emitter 100G, and the third inorganic light emitter 100B may constitute one pixel Pix. The transmission parts 8 may be provided for respective groups of the first inorganic light emitter 100R, the second inorganic light emitter 100G, and the third inorganic light emitter 100B. The array of the inorganic light emitters 100 is not limited to the examples illustrated in FIGS. 4 and 6 and may be any desired array.

Figure 8:
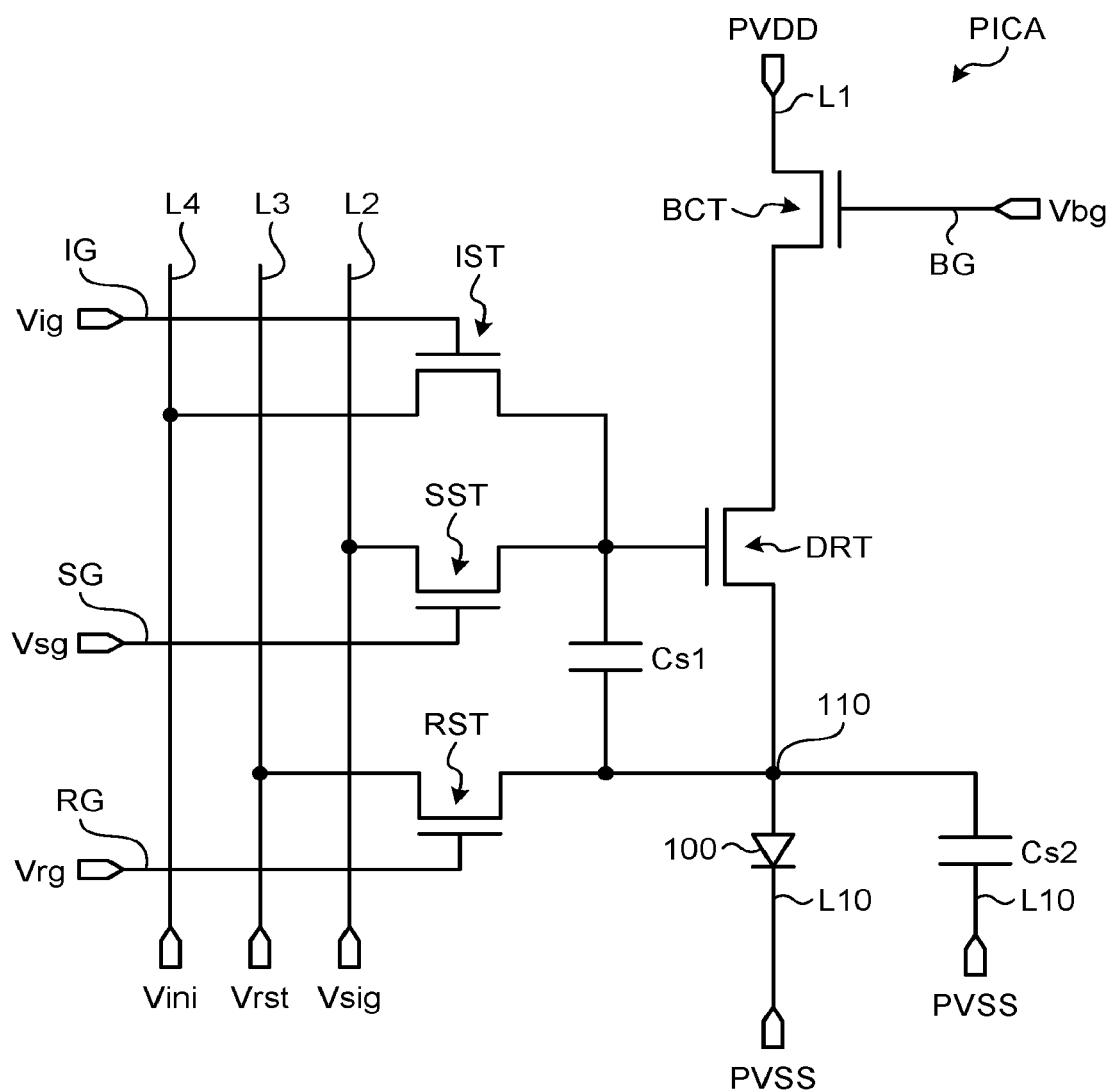
FIG. 8 is a circuit diagram for illustrating an example of the configuration of a pixel circuit in the display device.

FIG. 8 is a circuit diagram for illustrating an example of the configuration of a pixel circuit in the display device. A pixel circuit PICA illustrated in FIG. 8 is provided to each of the first pixel 49R, the second pixel 49G, and the third pixel 49B. The pixel circuit PICA is provided to the substrate 10 to supply drive signals (electric current) to the inorganic light emitter 100. The explanation of the pixel circuit PICA with reference to FIG. 8 is applicable to the respective pixel circuits PICA included in the first pixel 49R, the second pixel 49G, and the third pixel 49B.

As illustrated in FIG. 8, the pixel circuit PICA includes the inorganic light emitter 100, five transistors, and two capacitances. Specifically, the pixel circuit PICA includes a light emission control transistor BCT, an initialization transistor IST, a writing transistor SST, a reset transistor RST, and a drive transistor DRT. Some of the transistors may be shared by the pixels 49 disposed side by side. The light emission control transistor BCT, for example, may be shared by three pixels 49 via common wiring. The reset transistors RST may be provided in the peripheral region GA and be each provided to one row of the pixels 49, for example. In this case, the reset transistor RST is coupled to the sources of a plurality of drive transistors DRT via common wiring.

The transistors included in the pixel circuit PICA are composed of n-type TFTs (thin-film transistors). However, the present embodiment is not limited thereto, and the transistors may be composed of p-type TFTs. To use p-type TFTs, the coupling form of power supply potential, holding capacitance Cs1, and capacitance Cs2 may be appropriately adapted.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 4). The drive circuits 12 supply light emission control signals Vbg, initialization control signals Vig, writing control signals Vsg, and reset control signals Vrg to the light emission control scanning line BG, the initialization control scanning line IG, the writing control scanning line SG, and the reset control scanning line RG, respectively.

The drive IC 210 (refer to FIG. 4) supplies video signals Vsig to the respective pixel circuits PICA of the first pixel 49R, the second pixel 49G, and the third pixel 49B in a time-division manner. A switching circuit, such as a multiplexer, is provided between each row of the first pixels 49R, the second pixels 49G, and the third pixels 49B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the inorganic light emitter 100 based on voltage between the gate and the drain.

The cathode (cathode electrode 114) of the inorganic light emitter 100 is coupled to a cathode power supply line L10. The anode (anode electrode 110) of the inorganic light emitter 100 is coupled to an anode power supply line L1 (first power supply line) via the drive transistor DRT and the light emission control transistor BCT. The anode power supply line L1 is supplied with anode power supply potential PVDD (first potential). The cathode power supply line L10 is supplied with cathode power supply potential PVSS (second potential). The anode power supply potential PVDD is higher than the cathode power supply potential PVSS. The cathode power supply line L10 includes the cathode wiring 60.

The pixel circuit PICA includes the capacitance Cs1 and the capacitance Cs2. The capacitance Cs1 is capacitance formed between the gate and the source of the drive transistor DRT. The capacitance Cs2 is additional capacitance formed between the cathode power supply line L10 and both the source of the drive transistor DRT and the anode of the inorganic light emitter 100.

The display device 2 drives the pixels 49 in the first row to the pixels 49 in the last row, thereby displaying an image of one frame in one frame period.

In the reset period, the electric potential of a light emission control scanning line BG is switched to an L (low) level, and the electric potential of a reset control scanning line RG is switched to an H (High) level by the control signals supplied from the drive circuits 12. As a result, the light emission control transistor BCT is turned off (electrically discontinuous state), and the reset transistor RST is turned on (electrically continuous state).

As a result, electric charges remaining in the pixel 49 flow to the outside via the reset transistor RST, and the source of the drive transistor DRT is fixed to the reset power supply potential Vrst. The reset power supply potential Vrst is set with a predetermined potential difference with respect to the cathode power supply potential PVSS. The potential difference between the reset power supply potential Vrst and the cathode power supply potential PVSS is smaller than the potential difference at which the inorganic light emitter 100 starts to emit light.

Subsequently, the electric potential of an initialization control scanning line IG is switched to the H level by the control signals supplied from the drive circuits 12. The initialization transistor IST is turned on. The gate of the drive transistor DRT is fixed to the initialization potential Vini via the initialization transistor IST.

The drive circuits 12 turn on the light emission control transistor BCT and turn off the reset transistor RST. When the source potential is equal to (Vini−Vth), the drive transistor DRT is turned off. As a result, a threshold voltage Vth of the drive transistor DRT can be acquired for each of the pixels 49, whereby variations in the threshold voltage Vth of the respective pixels 49 are offset.

In a subsequent video signal writing operation period, the light emission control transistor BCT is turned off, the initialization transistor IST is turned off, and the writing transistor SST is turned on by the control signals supplied from the drive circuits 12. The video signals Vsig are input to the gate of the drive transistor DRT in each of the pixels 49 belonging to one row. The video signal line L2 extends in the second direction Dy and is coupled to the pixels 49 in a plurality of rows belonging to the same column. As a result, the video signal writing operation period is performed row by row.

In a subsequent light emission operation period, the light emission control transistor BCT is turned on, and the writing transistor SST is turned off by the control signals supplied from the drive circuits 12. The anode power supply potential PVDD is supplied to the drive transistor DRT from the anode power supply line L1 via the light emission control transistor BCT. The drive transistor DRT supplies an electric current corresponding to the gate-source voltage to the inorganic light emitter 100. The inorganic light emitter 100 emits light with the luminance corresponding to the electric current.

The drive circuits 12 may drive the pixels 49 row by row, simultaneously drive the pixels 49 in two rows, or simultaneously drive the pixels 49 in three or more rows. The configuration of the pixel circuit PICA illustrated in FIG. 8 is given by way of example only and can be appropriately changed. The number of wires and the number of transistors in one pixel 49, for example, may be different from those illustrated in FIG. 8. The pixel circuit PICA may have a configuration of a current mirror circuit or the like. It can be said that at least one of the drive circuits 12 and the drive IC 210 is a driver that controls turning-on and -off the inorganic light emitters 100. The driver controls turning-on and -off the inorganic light emitters 100, thereby switching between displaying and stopping displaying an image on the display device 2.

Figure 9:
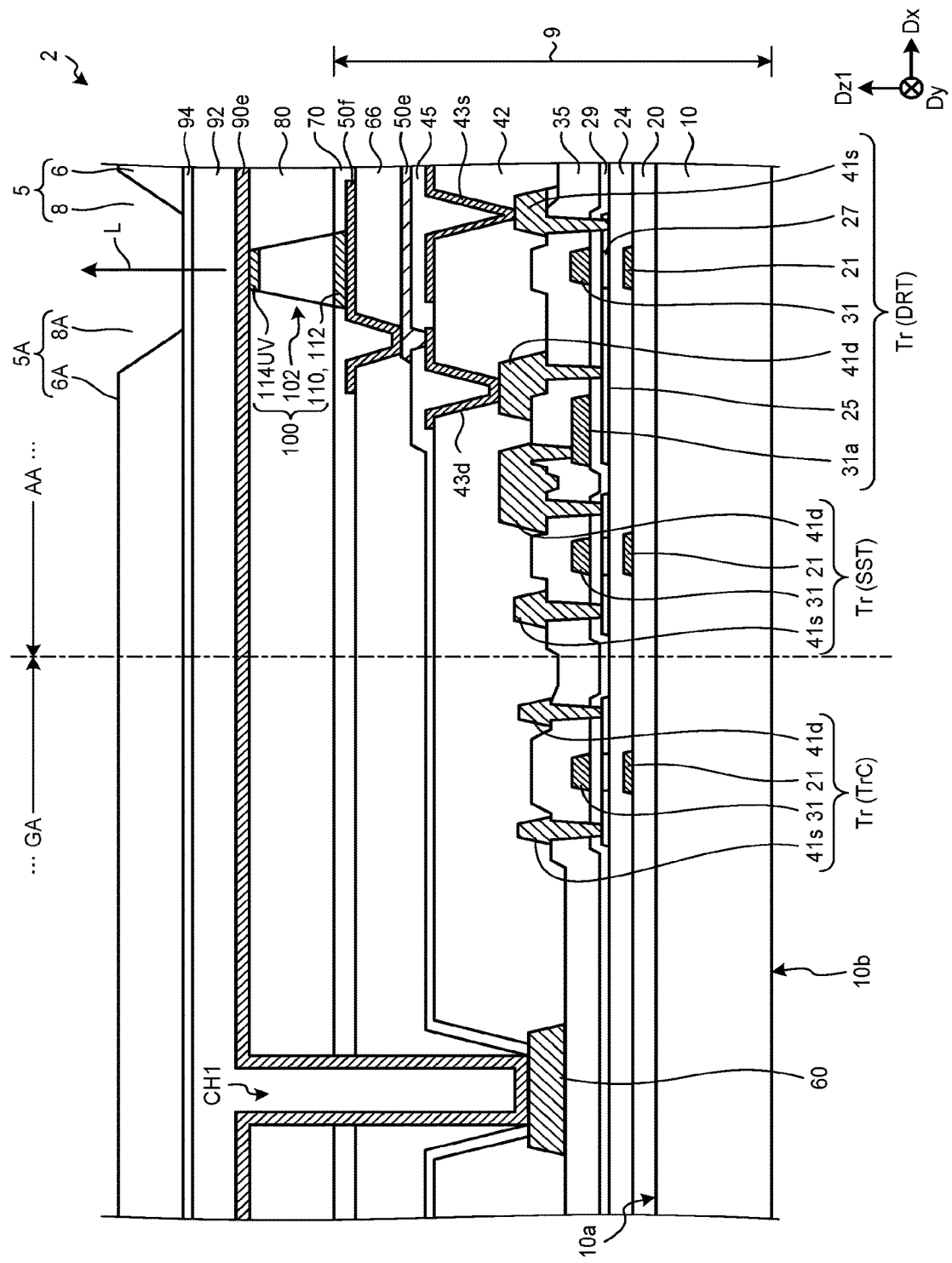
FIG. 9 is a schematic sectional view of the display device according to the present embodiment.

The following describes the multilayered structure of the display device 2. FIG. 9 is a schematic sectional view of the display device according to the present embodiment. As illustrated in FIG. 9, the array substrate 9 of the display device 2 includes the substrate 10 and a plurality of transistors. The substrate 10 has a first surface 10a and a second surface 10b opposite to the first surface 10a. The substrate 10 is an insulating substrate and is, for example, a glass substrate, a quartz substrate, or a flexible substrate made of acrylic resin, epoxy resin, polyimide resin, or polyethylene terephthalate (PET) resin.

In the present specification, a direction from the substrate 10 toward the inorganic light emitter 100 (direction Dz1) in a direction perpendicular to the surface of the substrate 10 is referred to as an "upper side" or simply as "on". A direction from the inorganic light emitter 100 to the substrate 10 (direction Dz2) is referred to as a "lower side" or simply as "under". To describe an aspect where a first structure is disposed on a second structure, the term "on" includes both of the following cases unless otherwise noted: a case where the first structure is disposed directly on the second structure in contact with the second structure, and a case where the first structure is disposed on the second structure with another structure interposed therebetween.

An undercoat layer 20 is provided on the first surface 10a of the substrate 10. A light-blocking layer may be provided on the first surface 10a of the substrate 10. In this case, the undercoat layer 20 covers the light-blocking layer. The light-blocking layer may be made of any desired material as long as it blocks light. The light-blocking layer is a molybdenum-tungsten alloy film, for example.

A plurality of transistors are provided on the undercoat layer 20. The drive transistors DRT and the writing transistors SST included in the pixels 49 are provided as the transistors in the display region AA of the substrate 10, for example. The transistors Trc included in the drive circuits 12 are provided as the transistors in the peripheral region GA of the substrate 10. While the drive transistor DRT, the writing transistor SST, and the transistor Trc out of the transistors are illustrated, the light emission control transistor BCT, the initialization transistor IST, and the reset transistor RST included in the pixel circuit PICA also have the same multilayered structure as that of the drive transistor DRT. In the following description, the transistors are simply referred to as transistors Tr when they need not be distinguished from one another.

The transistor Tr is a TFT having a dual-gate structure, for example. Each transistor Tr includes a first gate electrode 21, a second gate electrode 31, a semiconductor layer 25, a source electrode 41s, and a drain electrode 41d. The first gate electrode 21 is provided on the undercoat layer 20. An insulating film 24 is provided on the undercoat layer 20 and covers the first gate electrode 21. The semiconductor layer 25 is provided on the insulating film 24. The semiconductor layer 25 is made of polycrystalline silicon, for example. The material of the semiconductor layer 25 is not limited thereto and may be microcrystalline oxide semiconductor, amorphous oxide semiconductor, or low-temperature polycrystalline silicon, for example. An insulating film 29 is provided on the semiconductor layer 25. The second gate electrode 31 is provided on the insulating film 29.

The undercoat layer 20 and the insulating films 24, 29, and 45 are inorganic insulating films and are made of silicon oxide ($SiO_2$) or silicon nitride (SiN), for example. The first gate electrode 21 and the second gate electrode 31 face each other with the insulating film 24, the semiconductor layer 25, and the insulating film 29 interposed therebetween in the third direction Dz. The part of the insulating films 24 and 29 sandwiched by the first gate electrode 21 and the second gate electrode 31 functions as a gate insulating film. The part of the semiconductor layer 25 sandwiched by the first gate electrode 21 and the second gate electrode 31 serves as a channel region 27 of the transistor Tr. The part of the semiconductor layer 25 coupled to the source electrode 41s serves as a source region of the transistor Tr. The part of the semiconductor layer 25 coupled to the drain electrode 41d serves as a drain region of the transistor Tr. The part between the channel region 27 and the source region and the part between the channel region 27 and the drain region are each provided with a low-concentration impurity region. While n-type TFTs alone are illustrated as the transistors Tr, p-type TFTs may be simultaneously formed.

A gate line 31a is coupled to the second gate electrode 31 of the transistor DRT. The insulating film 29 is provided between the substrate 10 and the gate line 31a, and capacitance CS is formed between the gate line 31a and the substrate 10. The first gate electrode 21, the second gate electrode 31, and the gate line 31a are made of aluminum (Al), copper (Cu), silver (Ag), molybdenum (Mo), an alloy film made of these metals, or a multilayered film including these metals.

The structure of the transistor Tr according to the present embodiment is not limited to a dual-gate structure. The transistor Tr may have a bottom-gate structure in which the gate electrode is composed of only the first gate electrode 21. Alternatively, the transistor Tr may have a top-gate structure in which the gate electrode is composed of only the second gate electrode 31. The undercoat layer 20 is not necessarily provided.

The display device 2 includes an insulating film 35 provided on the first surface 10a of the substrate 10 to cover the transistors Tr. The source electrodes 41s are provided on the insulating film 35 and are each coupled to the source of the corresponding transistor Tr through a through hole formed in the insulating film 35. The drain electrodes 41d are provided on the insulating film 35 and are each coupled to the drain of the corresponding transistor Tr through a through hole formed in the insulating film 35. The cathode wiring 60 is provided on the insulating film 35 in the peripheral region GA. An insulating film 42 covers the source electrode 41s, the drain electrode 41d, and the cathode wiring 60. The insulating film 35 is an inorganic insulating film, and the insulating film 42 is an organic insulating film. The source electrode 41s and the drain electrode 41d are multilayered films made of TiAlTi or TiAl, which is a multilayered structure of titanium and aluminum. The insulating film 42 is made of organic material, such as photosensitive acrylic.

Part of the source electrode 41s is provided in a region overlapping the gate line 31a. The gate line 31a and the source electrode 41s facing each other with the insulating film 35 interposed therebetween form capacitance Cs1. The gate line 31a is provided in a region overlapping part of the semiconductor layer 25. The capacitance Cs1 includes capacitance formed by the semiconductor layer 25 and the gate line 31a facing each other with the insulating film 24 interposed therebetween.

The display device 2 includes source coupling wiring 43s, drain coupling wiring 43d, an insulating film 45, a counter anode electrode 50e, an insulating film 66, a coupling layer 50f, the inorganic light emitter 100, an insulating film 70, a flattening film 80, a counter cathode electrode 90e, an overcoat layer 92, a polarizing plate 94, and the surface layer 5. The source coupling wiring 43s is provided on the insulating film 42 and is coupled to the source electrode 41s through a through hole formed in the insulating film 42. The drain coupling wiring 43d is provided on the insulating film 42 and is coupled to the drain electrode 41d through a through hole formed in the insulating film 42. The insulating film 45 is provided on the insulating film 42 and covers the source coupling wiring 43s and the drain coupling wiring 43d. The counter anode electrode 50e is provided on the insulating film 45 and is coupled to the drain coupling wiring 43d of the drive transistor DRT through a through hole formed in the insulating film 45. The source coupling wiring 43s and the drain coupling wiring 43d are made of a transparent electric conductor, such as indium tin oxide (ITO).

The insulating film 66 is provided on the insulating film 45 and covers the counter anode electrode 50e. The coupling layer 50f is provided on the insulating film 66 and is coupled to the counter anode electrode 50e through a through hole formed in the insulating film 66. The inorganic light emitter 100 is provided on the coupling layer 50f. The coupling layer 50f may be a solder layer, for example. While the coupling layer 50f is coupled to the counter anode electrode 50e through the through hole formed in the insulating film 66 in FIG. 9, no insulating film 66 may be provided and the coupling layer 50f may be formed directly on the counter anode electrode 50e. The counter anode electrode 50e is coupled to an anode electrode 110 of the inorganic light emitter 100 via the coupling layer 50f. Capacitance Cs2 is formed between the counter anode electrode 50e and the source coupling wiring 43s facing each other with the insulating film 45 interposed therebetween.

The insulating film 70 is provided on the insulating film 45 and covers the coupling layer 50f and the side surfaces of the anode electrode 110 of the inorganic light emitter 100. The insulating film 70 has an opening for mounting the inorganic light emitter 100 at a position overlapping the anode electrode 110. The area of the opening of the insulating film 70 is larger than the contact area of the inorganic light emitter 100 with the counter anode electrode 50e in planar view. The area of the counter anode electrode 50e is larger than the contact area of the inorganic light emitter 100 with the counter anode electrode 50e in planar view. The flattening film 80 is provided on the insulating film 70 and covers the side surfaces of the inorganic light emitter 100. The counter cathode electrode 90e is provided on the flattening film 80. The insulating film 70 is an inorganic insulating film and is a silicon nitride film (SiN), for example. The flattening film 80 is an organic insulating film or an inorganic-organic hybrid insulating film (made of material in which an organic group (a methyl or phenyl group) is bonded to a main chain of Si—O, for example). The upper surface (cathode electrode 114) of the inorganic light emitter 100 is exposed from the flattening film 80. The counter cathode electrode 90e is coupled to the cathode electrode 114 of the inorganic light emitter 100.

The counter cathode electrode 90e is coupled to the cathode wiring 60 provided on the array substrate 9 through a contact hole CH1 formed outside the display region AA. Specifically, the contact hole CH1 is formed in the flattening film 80 and the insulating film 42, and the cathode wiring 14 is provided at the bottom of the contact hole CH1. The cathode wiring 60 is provided on the insulating film 35. In other words, the cathode wiring 60 is provided in the same layer and is made of the same material as those of the source electrode 41s and the drain electrode 41d. The counter cathode electrode 90e is continuously provided from the display region AA to the peripheral region GA and is coupled to the cathode wiring 60 at the bottom of the contact hole CH1.

The overcoat layer 92 is provided on the counter cathode electrode 90e. The overcoat layer 92 is an insulating film. The overcoat layer 92 may be a multilayered body composed of an inorganic insulating film made of silicon oxide ($SiO_2$) or silicon nitride (SiN), for example, and an organic insulating film. The polarizing plate 94 is provided on the overcoat layer 92. The polarizing plate 94 allows light having components that oscillate in a predetermined direction to pass therethrough in incident light and blocks light having components that oscillate in directions other than the predetermined direction. The polarizing plate 94 is a circularly polarizing plate in the present embodiment. The surface layer 5 is provided on the polarizing plate 94. In the surface layer 5, the transmission parts 8 overlap the inorganic light emitters 100 in planar view, and the blocking part 6 corresponding to the part other than the transmission parts 8 does not overlap the inorganic light emitters 100.

Figure 10:
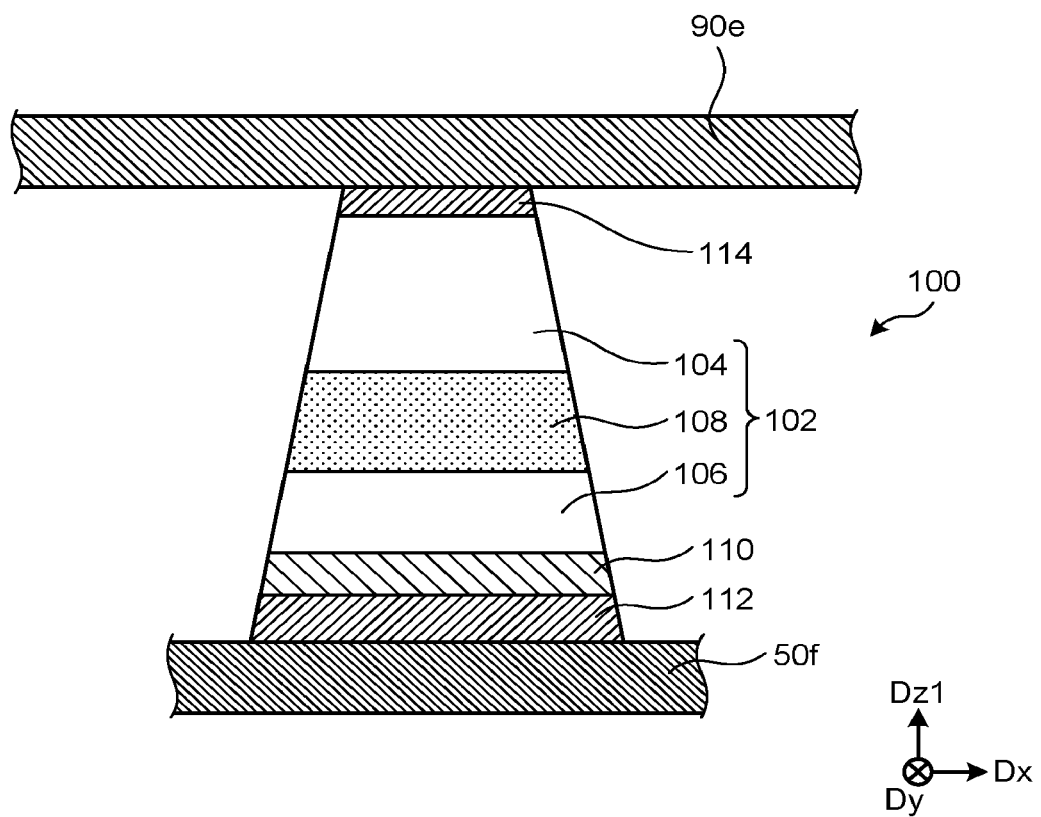
FIG. 10 is a sectional view for illustrating an example of the configuration of an inorganic light emitter according to the present embodiment.

The following describes the configuration of the inorganic light emitter 100. FIG. 10 is a sectional view for illustrating an example of the configuration of the inorganic light emitter according to the present embodiment. As illustrated in FIG. 10, the inorganic light emitter 100 includes an inorganic light emitting element 102, the anode electrode 110, a reflective layer 112, and the cathode electrode 114. The inorganic light emitter 100 may include the counter anode electrode 50e, the coupling layer 50f, and the counter cathode electrode 90e.

The inorganic light emitting element 102 is a light emission layer that emits light. The inorganic light emitting element 102 includes an n-type cladding layer 104, a p-type cladding layer 106, and a light emission layer 108 provided between the p-type cladding layer 106 and the n-type cladding layer 104. In the inorganic light emitting element 102 according to the present embodiment, the p-type cladding layer 106, the light emission layer 108, and the n-type cladding layer 104 are layered in order toward the upper side. A substrate (light emitting element substrate) made of silicon carbide or sapphire, for example, may be provided on the lower side of the p-type cladding layer 106. After a diode structure is formed using this substrate, the substrate is reduced in thickness by grinding the back surface and is divided into chips by dicing. While most part of the substrate is removed in grinding the back surface, part thereof may remain under the p-type cladding layer. The inorganic light emitting element 102 is made of compound semiconductor, such as gallium nitride (GaN), aluminum indium gallium phosphorous (AlInGaP), aluminum gallium arsenic (AlGaAs), and gallium arsenic phosphorus (GaAsP). More specifically, the p-type cladding layer 106 and the n-type cladding layer 104 according to the present embodiment are made of gallium nitride (GaN), for example. The light emission layer 108 is made of indium gallium nitride (InGaN), for example. The light emission layer 108 may have a multi-quantum well structure (MQW) in which InGaN and GaN are layered.

In the first inorganic light emitter 100R, for example, the light emission layer 108 of the inorganic light emitting element 102 may be made of aluminum gallium indium phosphide having a composition ratio among aluminum, gallium, and indium of 0.225:0.275:0.5. The p-type cladding layer 106 and the n-type cladding layer 104 may be made of aluminum indium phosphide. The light emitting element substrate may be made of gallium arsenide. In the second inorganic light emitter 100G, for example, the light emission layer 108 of the inorganic light emitting element 102 may be made of indium gallium nitride having a composition ratio of indium to gallium of 0.45:0.55. The p-type cladding layer 106 and the n-type cladding layer 104 may be made of gallium nitride. The light emitting element substrate may be made of silicon carbide. In the third inorganic light emitter 100B, for example, the light emission layer 108 of the inorganic light emitting element 102 may be made of indium gallium nitride having a composition ratio of indium to gallium of 0.2:0.8. The p-type cladding layer 106 and the n-type cladding layer 104 may be made of gallium nitride. The light emitting element substrate may be made of silicon carbide.

In the inorganic light emitter 100, the reflective layer 112, the anode electrode 110, the p-type cladding layer 106, the light emission layer 108, the n-type cladding layer 104, and the cathode electrode 114 are layered in order toward the upper side. The coupling layer 50f is provided under the inorganic light emitter 100, and the counter cathode electrode 90e is provided on the inorganic light emitter 100.

The counter anode electrode 50e includes conductive material, more specifically, metal material in this example. The counter anode electrode 50e according to the present embodiment includes titanium (Ti) and aluminum (Al), and Ti layers and Al layers are layered along the third direction Dz, for example. The coupling layer 50f includes conductive material, more specifically, metal material in this example. The coupling layer 50f is made of silver paste, that is, silver tin (AgSn), or gold paste, that is, gold tin (AuSn), for example, and couples the counter anode electrode 50e and the anode electrode 110.

The reflective layer 112 is provided on the coupling layer 50f. The reflective layer 112 is a conductive member that can reflect light and is made of an alloy including silver (Ag) according to the present embodiment. The anode electrode 110 is provided on the reflective layer 112. The anode electrode 110 is a translucent conductive member, such as ITO. The anode electrode 110 is electrically coupled to the counter anode electrode 50e via the reflective layer 112 and the coupling layer 50f. The p-type cladding layer 106 is provided on the anode electrode 110. The anode electrode 110 is coupled to the p-type cladding layer 106.

The cathode electrode 114 is provided on the n-type cladding layer 104. The cathode electrode 114 is coupled to the n-type cladding layer 104. The cathode electrode 114 is a translucent conductive member, such as ITO. The cathode electrode 114 is coupled to the counter cathode electrode 90e. The counter cathode electrode 90e is a translucent conductive member, such as ITO.

The inorganic light emitter 100 is manufactured as follows: first, the layers constituting the inorganic light emitting element 102 are deposited on the light emitting element substrate; next, the light emitting element substrate is reduced in thickness to form the anode electrode 110 and the reflective layer 112 on the lower surface; and after that, the obtained multilayered structure is cut into a square and is disposed on the coupling layer 50f, for example. If silver paste is used for the coupling layer 50f, the inorganic light emitting element 102 is deformed by temporary pressure and adheres and is electrically continuous with the coupling layer 50f. Alternatively, the coupling layer 50f may be made of the same material as that of the anode electrode 110 and the reflective layer 112, for example. In this case, by disposing the inorganic light emitting element 102 and then heating it, the inorganic light emitting element 102 can be integrated with and electrically continuous with the coupling layer 50f.

Figure 11:
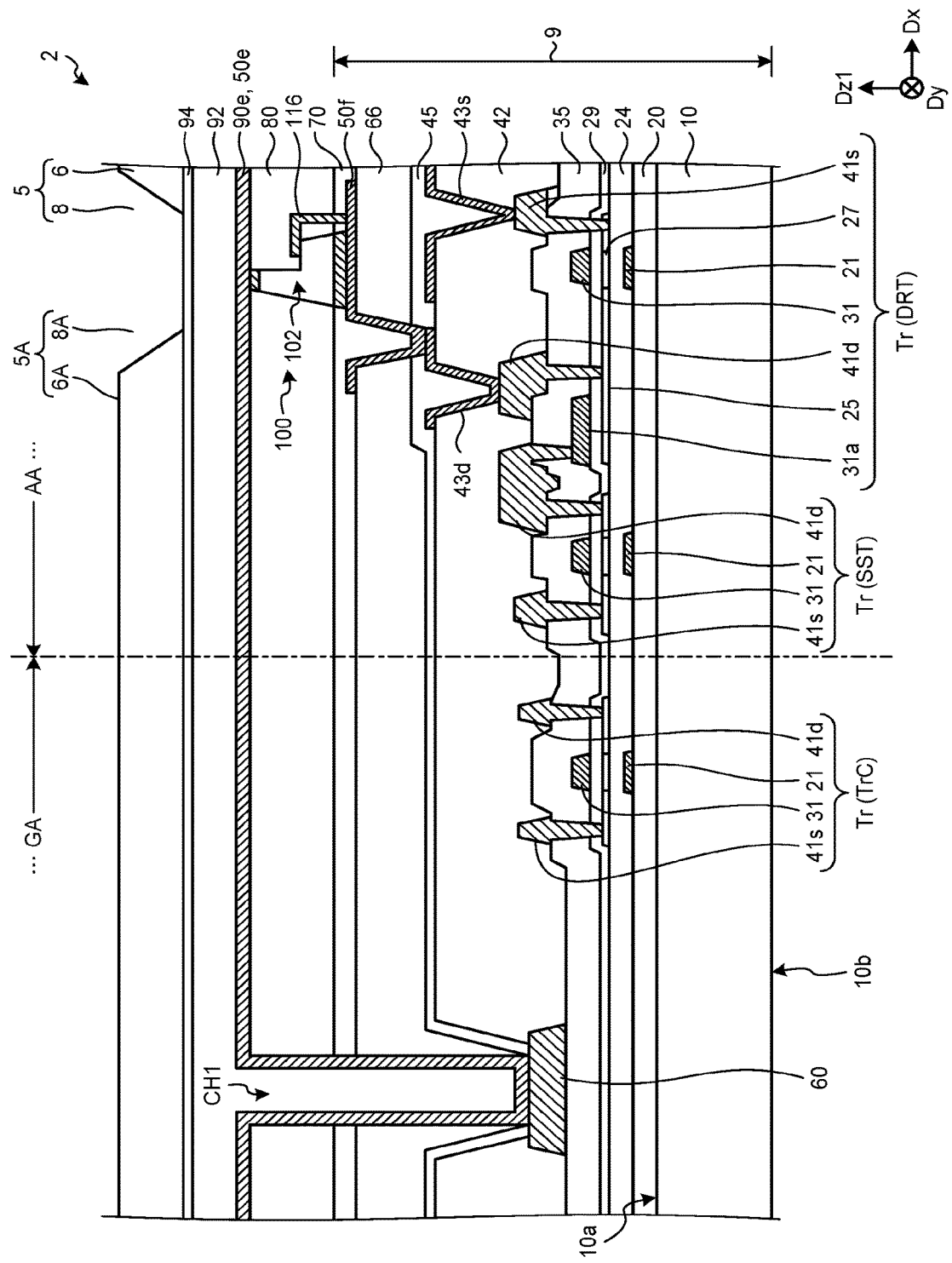
FIG. 11 is a sectional view for illustrating another example of the configuration of the display device according to the present embodiment.

The display device 2 has the multilayered structure described above. In the above description, the display device 2 is a type of device in which the inorganic light emitter 100 is coupled to the counter anode electrode 50e at the lower surface (anode electrode 110) and to the counter cathode electrode 90e at the upper surface (cathode electrode 114). The display device 2 is not limited to this type, and the inorganic light emitter 100 may be coupled to the counter anode electrode 50e and the counter cathode electrode 90e at one of the upper surface and the lower surface. FIG. 11 is a sectional view for illustrating another example of the configuration of the display device according to the present embodiment. In FIG. 11, the counter anode electrode 50e and the counter cathode electrode 90e are provided on the upper side of the inorganic light emitter 100. The inorganic light emitter 100 is provided with a coupling part 116. The coupling part 116 electrically couples the counter cathode electrode 90e on the upper side of the inorganic light emitter 100 to the coupling layer 50f. The coupling part 116 is a conductive member and may be made of a molybdenum-tungsten alloy or a multilayered film of a molybdenum-tungsten alloy and aluminum, for example. Unlike FIG. 11, the counter anode electrode 50e and the counter cathode electrode 90e may be provided on the lower side of the inorganic light emitter 100.

(Method for Assembling the Display System)

Figure 12:
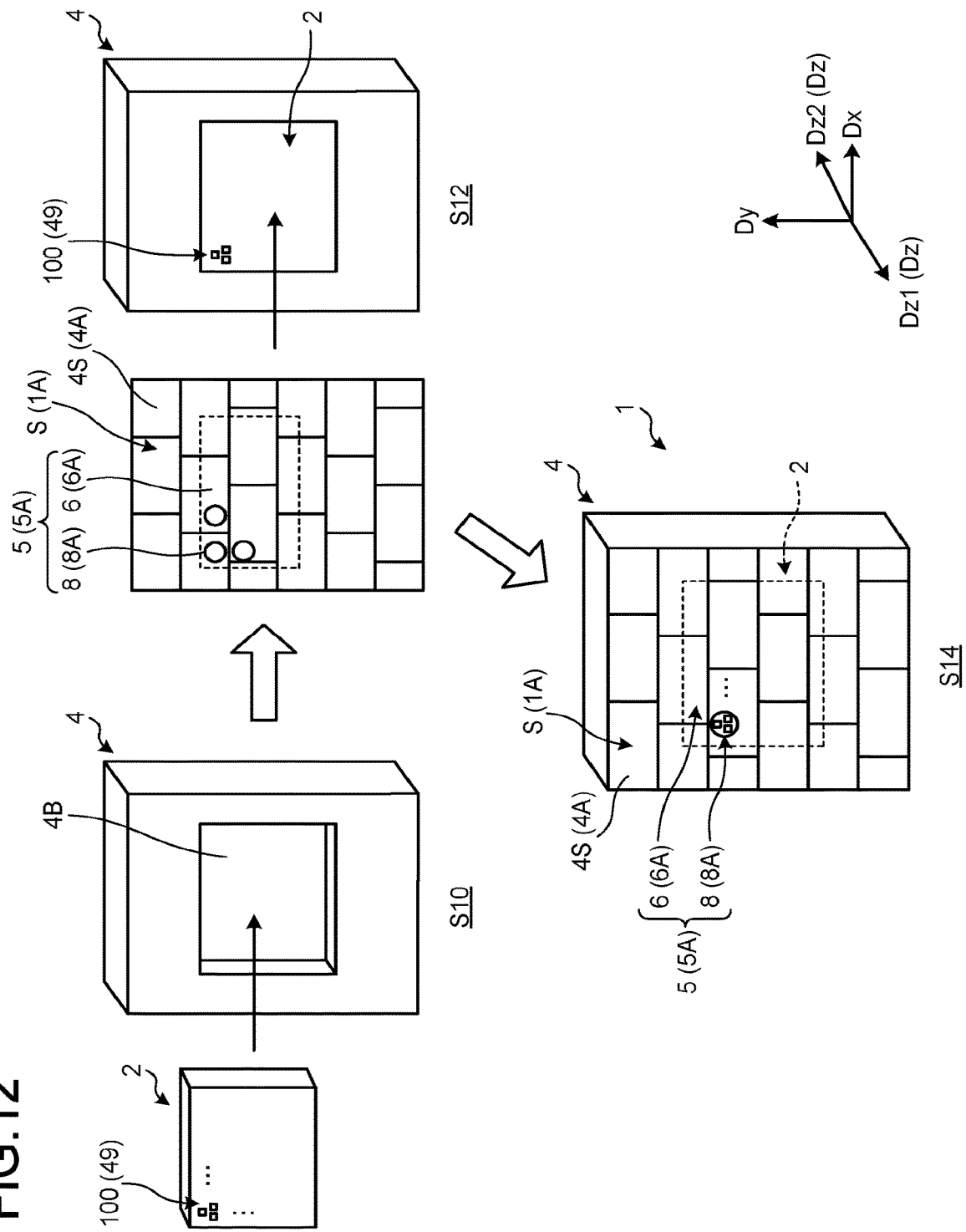
FIG. 12 is a view for explaining a method for assembling the display system according to the present embodiment.

The following describes a method for assembling the display system 1. FIG. 12 is a view for explaining a method for assembling the display system according to the present embodiment. To assemble the display system 1, the display device 2 is attached to the base 4 as illustrated in Step S10 in FIG. 12. Specifically, the display device 2 is housed in the recess 4B of the base 4. At Step S10, the surface layer 5 is not attached to the display device 2, and a base surface layer 4S that constitutes the surface 4A is not attached to the base 4.

After the display device 2 is attached to the base 4, a surface part S is attached to the display device 2 and the base 4 as illustrated in Step S12. The surface part S is a sheet-like member to cover the surface of the display device 2 having no surface layer 5 attached thereto and the surface of the base 4 having no base surface layer 4S attached thereto. The surface part S is a member integrating the base surface layer 4S and the surface layer 5. In other words, the surface part S includes a part that constitutes the base surface layer 4S and a part that constitutes the surface layer 5. The part that constitutes the surface layer 5 in the surface part S includes the blocking part 6 and the transmission parts 8. In the surface part S, the surface 4A of the part that constitutes the base surface layer 4S and the surface 5A of the part that constitutes the surface layer 5 continuously extend to constitute the surface 1A. The surface 5A of the part that constitutes the surface layer 5 includes the surface 6A of the blocking part 6 and the transmission surfaces 8A of the transmission parts 8. Thus, it can be said that the surface 6A of the part that constitutes the blocking part 6 and the surface 4A of the part that constitutes the base surface layer 4S continuously extend in the surface part S. The base surface layer 4S according to the present embodiment has no opening, such as the transmission part 8.

At Step S12, the surface part S is attached to the display device 2 and the base 4 such that the part that constitutes the surface layer 5 overlaps the display device 2 having no surface layer 5 attached thereto and that the base surface layer 4S overlaps the base 4 having no base surface layer 4S attached thereto in planar view. Subsequently, the surface part S is fixed (e.g., bonded) to the display device 2 and the base 4. More specifically, at Step S12, the surface part S is attached such that the transmission parts 8 overlap the inorganic light emitters 100 (pixels Pix) of the display device 2 in planar view.

By attaching the surface part S to the display device 2 and the base 4, assembling the display system 1 is completed as illustrated in Step S14. In the display system 1, the display device 2 and the surface layer 5 overlap in planar view, and the region of the part provided with the display device 2 serves as the surface 5A in planar view. In the surface 5A, the regions in which the transmission parts 8 and the inorganic light emitters 100 (pixels Pix) overlap serve as the transmission surfaces 8A in planar view, and the region other than the transmission surfaces 8A serves as the surface 6A. In the display system 1, the base 4 and the base surface layer 4S overlap in planar view, and the region provided with the base 4 serves as the surface 4A.

As described above, the surface part S integrating the base surface layer 4S and the surface layer 5 in the present embodiment is attached to the display device 2 and the base 4. However, the base surface layer 4S and the surface layer 5 may be provided separately. In this case, the surface layer 5 is attached to the display device 2 such that the transmission parts 8 overlap the inorganic light emitters 100 (pixels Pix) of the display device 2. Subsequently, the display device 2 with the surface layer 5 attached thereto is attached to the base 4 with the base surface layer 4S attached thereto. However, the surface layer 5 may be attached to the display device 2 after the display device 2 is attached to the base 4. The surface layer 5 may be attached to the display device 2 by bonding the surface layer 5 to a transparent substrate, for example, and attaching the surface layer 5 with the transparent substrate bonded thereto to the display device 2 such that the transmission parts 8 of the surface layer 5 overlap the inorganic light emitters 100 (pixels Pix) of the display device 2. The transparent substrate may be a desired member as long as it allows visible light, such as the light L, to pass therethrough, and may be made of glass or resin. Alternatively, the transmission parts 8 may be formed by bonding the surface layer 5 having no transmission part 8 formed thereon (that is, the surface layer 5 having only the blocking part 6) to a substrate and punching both the substrate and the surface layer 5 at once with a die or the like. In this case, the substrate may be a member made of resin that does not allow visible light, such as the light L, to pass therethrough.

(Appearance of the Display System)

Figure 13:
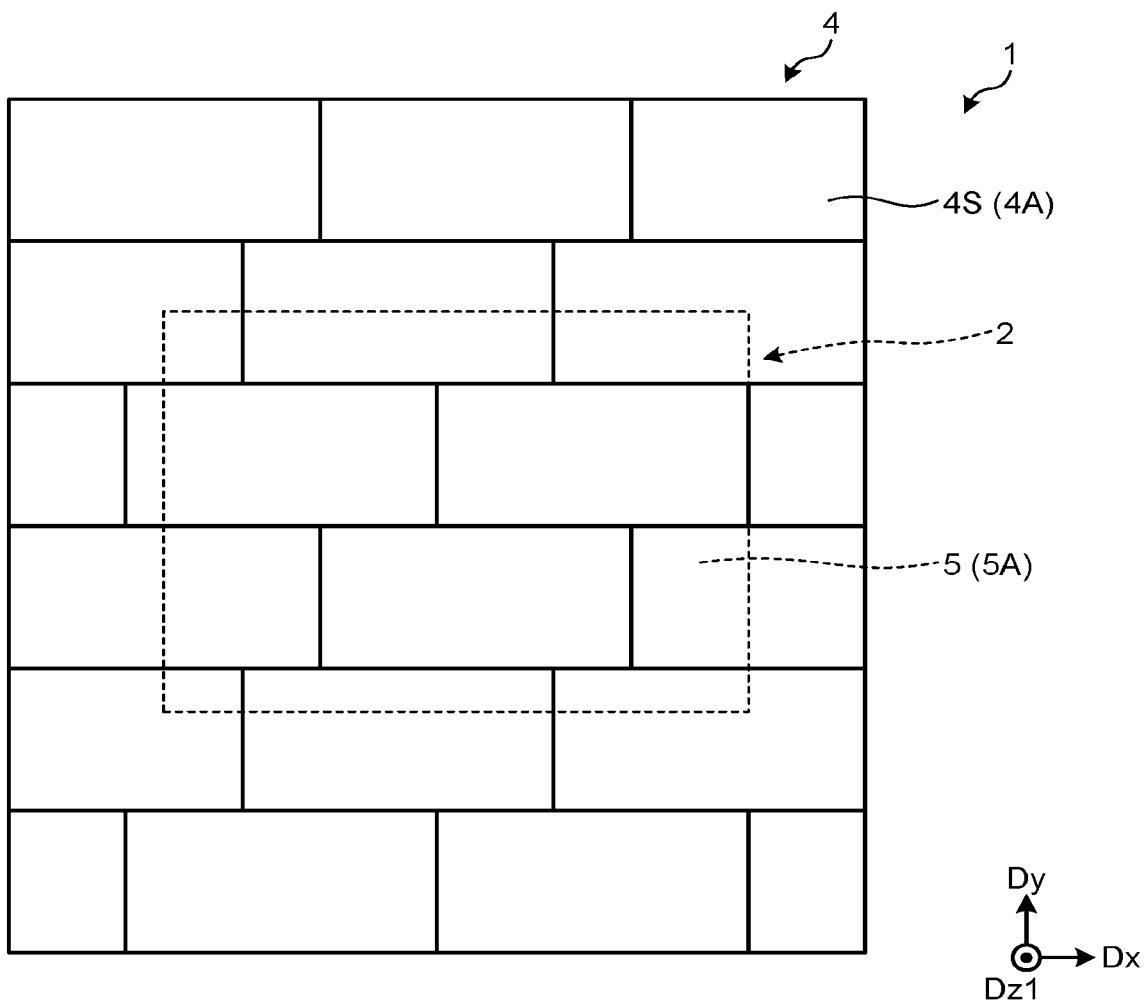
FIG. 13 is a schematic for illustrating an external appearance of the display system when the inorganic light emitters are turned off.
Figure 14:
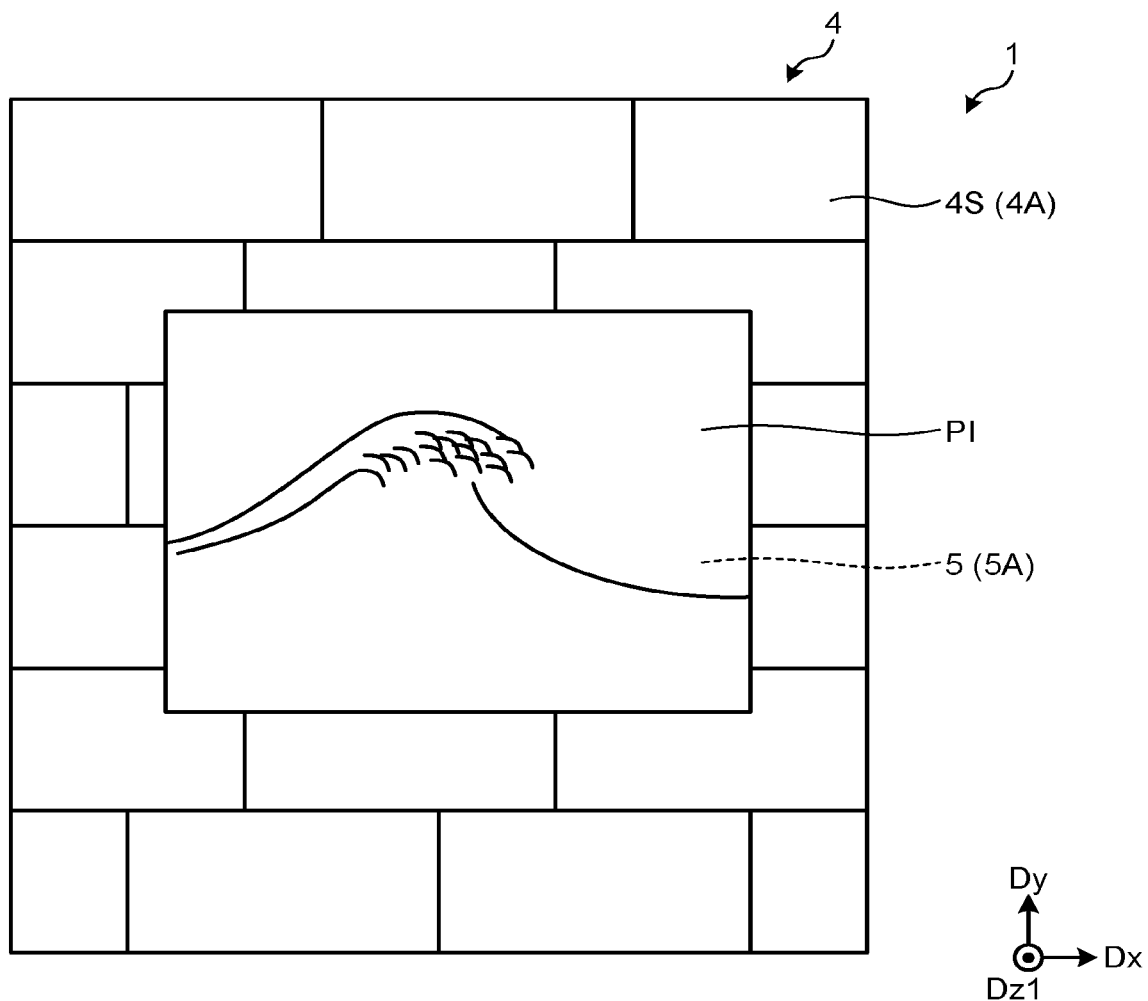

The following describes the appearance of the display system 1 when it is visually recognized. FIG. 13 is a schematic for illustrating an external appearance of the display system when the inorganic light emitters are turned off. FIG. 14 is a schematic for illustrating an external appearance of the display system when the inorganic light emitters are turned on. As illustrated in FIG. 13, when the inorganic light emitters 100 of the display device 2 are turned off, more specifically, when all the inorganic light emitters 100 of the display device 2 are turned off, the inorganic light emitters 100 do not emit the light L. Therefore, if the display system 1 is seen in planar view when the inorganic light emitters 100 are turned off, the surface 5A of the surface layer 5 of the display device 2 is visually recognized, and the external appearance of the surface 5A of the display device 2 and the external appearance of the surface 4A of the base 4 are visually recognized to seem to continuously extend as the surface 1A in the display system 1. More specifically, when the inorganic light emitters 100 are turned off, the external appearance of the surface 6A of the blocking part 6 of the display device 2 and the external appearance of the surface 4A of the base 4 are visually recognized to seem to continuously extend in the display system 1 because the transmission parts 8 of the surface layer 5 are so small that they are hard to visually recognize. As described above, when the inorganic light emitters 100 are turned off, the boundary between the surface 5A and the surface 4A is not visually recognized, the surface 4A and the surface 5A are indistinguishable, and the surface 4A and the surface 5A are visually recognized as the same single surface 1A. As described above, when the display device 2 is turned off, the display system 1 makes the surface 5A of the display device 2 and the surface 4A of the base 4 hard to distinguish, causes the display device 2 to be visually recognized as the base 4, and makes the display device 2 inconspicuous. If a person comes closer to the display device 2, for example, the inorganic light emitters 100 and the wiring therearound may possibly be visually recognized through the transmission parts 8. The polarizing plate 94 can suppress reflection of visible light on the inorganic light emitters 100 and the wiring therearound, thereby making them hard to visually recognize.

By contrast, when the inorganic light emitters 100 of the display device 2 are turned on as illustrated in FIG. 14, the light L from the inorganic light emitters 100 passes through the transmission parts 8 facing the inorganic light emitters 100 in the direction Dz1 and is emitted toward the outside of the display device 2. In other words, when the inorganic light emitters 100 are turned on, the light L from the inorganic light emitters 100 is projected from the transmission surfaces 8A. Therefore, if the display system 1 is seen in planar view when the inorganic light emitters 100 are turned on, an image PI due to the light L from the inorganic light emitters 100 having passed through the transmission surfaces 8A is visually recognized in the direction Dz1 with respect to the surface layer 5, and the surface 5A is hidden by the image PI in the display system 1. The surface 4A of the base 4 around the image PI is also visually recognized. In other words, if the display system 1 is seen in planar view when the inorganic light emitters 100 are turned on, the image PI displayed by the light L of the inorganic light emitters 100 and the surface 4A of the base 4 are visually recognized in the display system 1. The inorganic light emitters 100 are small in size and have a large spread angle for the light L. As a result, the image PI can be appropriately displayed by the light L emitted from the inorganic light emitters 100 and having passed through the transmission parts 8 if the transmission parts 8 are made small so that they are not visually recognized when the inorganic light emitters 100 are turned off.

As described above, the display system 1 according to the present embodiment includes the base 4 and the display device 2 attached to the base 4. The display device 2 includes the inorganic light emitters 100 arrayed in a matrix with a row-column configuration and the surface layer 5 including the transmission parts 8 and the blocking part 6. The surface layer 5 is provided in the traveling direction of the light L emitted from the inorganic light emitters 100, that is, in the direction Dz1 with respect to the inorganic light emitters 100. The transmission parts 8 are provided in a matrix with a row-column configuration so as to overlap the inorganic light emitters 100 when viewed from the direction Dz1 and allow the light L from the inorganic light emitters 100 to pass therethrough. The blocking part 6 blocks the light L from the inorganic light emitters 100. The inorganic light emitters 100 are provided overlapping the transmission parts 8 provided in the surface layer 5.

The display system 1 according to the present embodiment is provided with the transmission parts 8 and the blocking part 6 in the direction Dz1 with respect to the inorganic light emitters 100. The inorganic light emitters 100 overlap the transmission parts 8. When the inorganic light emitters 100 are turned on, the display system 1 can project the light L from the inorganic light emitters 100 to the outside through the transmission parts 8, thereby appropriately displaying the image PI. When the inorganic light emitters 100 are turned off, the light L from the inorganic light emitters 100 is not projected, so that the surface 6A of the blocking part 6 can be visually recognized. Consequently, when the inorganic light emitters 100 are turned off, the surface 5A of the surface layer 5 (surface 6A of the blocking part 6) and the surface 4A of the base 4 are hard to distinguish, and therefore the display device 2 and the base 4 are visually integrally recognized, so that the display device 2 can be inconspicuous. The present embodiment can reduce a feeling of pressure caused by the display device 2 in a room or the like especially if the display device 2 is large in size.

When the inorganic light emitters 100 are turned on, the image PI displayed by the light L from the inorganic light emitters 100 having passed through the transmission parts 8 and the surface 4A of the base 4 are visually recognized in the display system 1. When the inorganic light emitters 100 are turned off, the surface 5A of the surface layer 5 and the surface 4A of the base 4 are visually recognized to seem to continuously extend in the display system 1. In the display system 1 according to the present embodiment, the image PI is appropriately displayed when the display device 2 is turned on, and the external appearance of the surface 5A of the surface layer 5 and the external appearance of the surface 4A of the base 4 are visually recognized to seem to continuously extend when the display device 2 is turned off. Consequently, the display system 1 can make the display device 2 inconspicuous.

It is preferable that the surface layer 5 and the base surface layer 4S that constitutes the surface 4A of the base 4 be an integrated member. With the surface layer 5 and the base surface layer 4S provided as an integrated member (surface part S), the display system 1 can make the surface 5A of the surface layer 5 and the surface 4A of the base 4 hard to distinguish and make the display device 2 inconspicuous.

The surface layer 5 and the base surface layer 4S that constitutes the surface 4A of the base 4 may be separate members. If the surface layer 5 and the base surface layer 4S are separate members, the surface 6A of the blocking part 6 can be visually recognized when the inorganic light emitters 100 are turned off. Consequently, the display system 1 can cause the display device 2 and the base 4 to be visually integrally recognized and make the display device 2 inconspicuous.

The surface 6A of the blocking part 6 and the surface 4A of the base 4 are the same in at least one of shape, pattern, and color. By making the surface 6A and the surface 4A the same in at least one of shape, pattern, and color, the display system 1 can make the surface 6A and the surface 4A hard to distinguish and make the display device 2 inconspicuous. The surface 6A of the blocking part 6 and the surface 4A of the base 4 may be the same in all of shape, pattern, and color.

(Modifications)

The following describes modifications of the embodiment above. FIG. 15A and FIG. 15B are a schematic of the display system according to a first modification. As illustrated in the first modification in FIG. 15A and FIG. 15B, the display system 1 may include an illuminator 96 that emits light LI to the surface 5A of the surface layer 5 of the display device 2. In this case, for the illuminator 96, emission of the light LI that is visible light is controlled by an illuminator controller, which is not illustrated. As illustrated in FIG. 15A, the illuminator 96 emits the light LI to the surface 5A of the surface layer 5 when the inorganic light emitters 100 of the display device 2 are turned off, that is, when the display device 2 does not display the image PI. The illuminator 96 may emit the light LI to the surface 5A of the surface layer 5 and the surface 4A of the base 4 around the surface 5A. As illustrated in FIG. 15B, the illuminator 96 stops emitting the light LI when the inorganic light emitters 100 of the display device 2 are turned on, that is, when the display device 2 displays the image PI. As described above, the illuminator 96 emits the light to the surface 5A when the inorganic light emitters 100 are turned off and stops emitting the light to the surface 5A when the inorganic light emitters 100 are turned on. With this mechanism, the display system 1 brightens the base 4 when not displaying the image PI and stops emitting the light to the surfaces 4A and 5A when displaying the image PI. Consequently, the display system 1 can suppress reflection of visible light on the surfaces 4A and 5A and suppress reduction in contrast of the image PI.

To attach the surface layer 5 having the transmission parts 8 formed thereon to the display device 2, it is necessary for the embodiment described above to align the transmission parts 8 of the surface layer 5 with the inorganic light emitters 100 (pixels Pix) of the display device 2. As described in a second modification below, however, the surface layer 5 having no transmission part 8 formed thereon may be attached to the display device 2, and the transmission parts 8 may be subsequently formed so as to overlap the inorganic light emitters 100. The following specifically describes the second modification.

Figure 16:
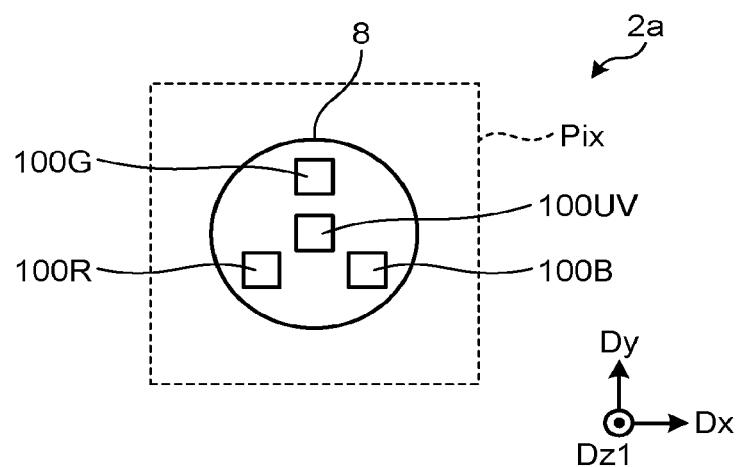
FIG. 16 is a schematic for illustrating a pixel according to a second modification.

FIG. 16 is a schematic for illustrating the pixel according to the second modification. As illustrated in FIG. 16, one pixel Pix of a display device 2a according to the second modification may be provided with an ultraviolet light emitting part 100UV besides the first inorganic light emitter 100R, the second inorganic light emitter 100G, and the third inorganic light emitter 100B. The ultraviolet light emitting part 100UV is an inorganic light emitting element assembly that emits ultraviolet rays $L_{UV}$. In one pixel Pix, the ultraviolet light emitting part 100UV is preferably positioned at the center of the pixel Pix in planar view. In other words, the ultraviolet light emitting part 100UV is preferably disposed at the position of the center point of a polygon the vertices of which are the other inorganic light emitters 100 (the first inorganic light emitter 100R, the second inorganic light emitter 100G, and the third inorganic light emitter 100B) of the pixel Pix in planar view.

Figure 17:
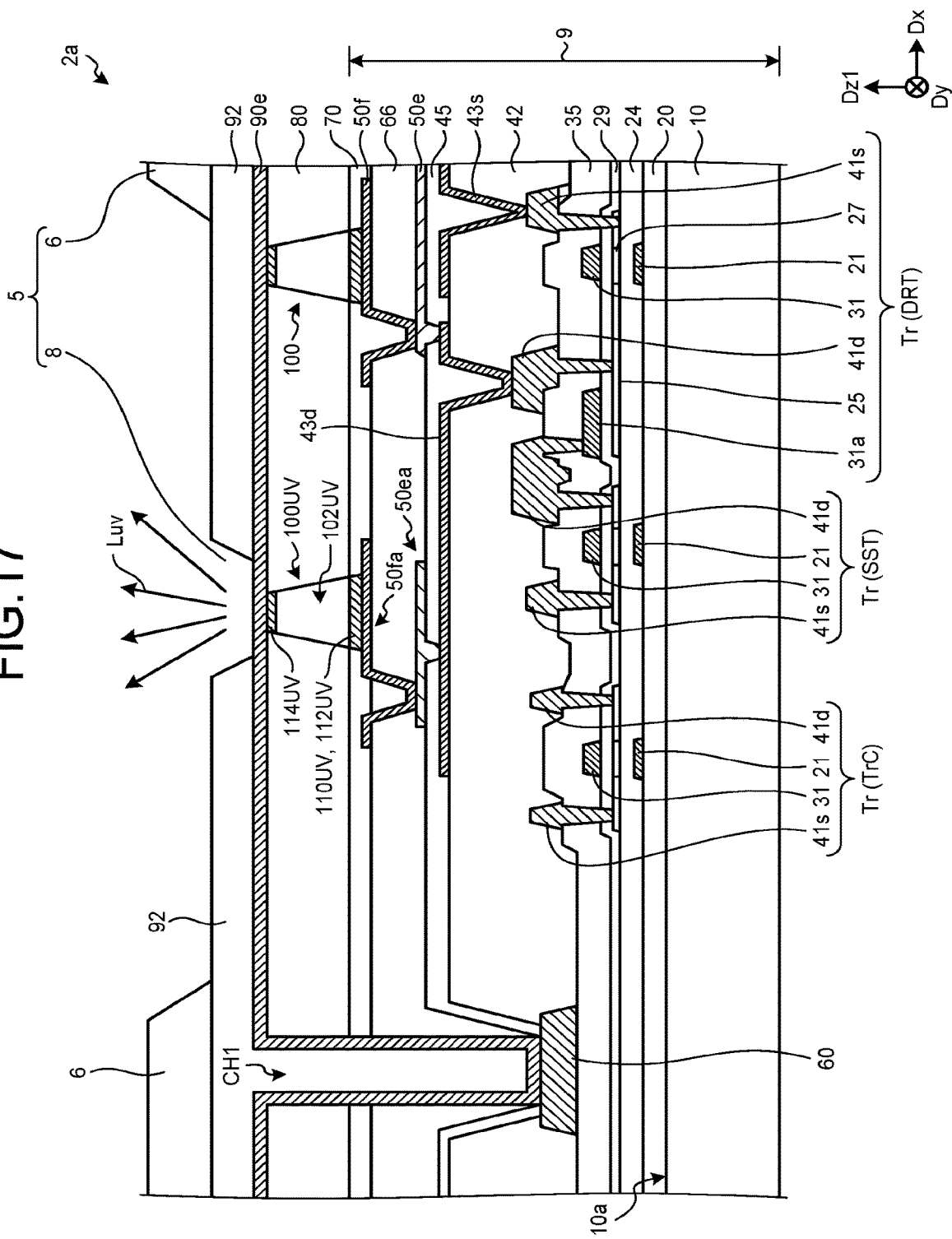
FIG. 17 is a sectional view for illustrating an example of the configuration of a display device according to the second modification.

FIG. 17 is a sectional view for illustrating an example of the configuration of the display device according to the second modification. As illustrated in FIG. 17, the display device 2a according to the second modification includes a counter anode electrode 50ea, a coupling layer 50fa, and the ultraviolet light emitting part 100UV. The counter anode electrode 50ea is provided on the insulating film 45 and is coupled to the drain coupling wiring 43d of the drive transistor DRT through a through hole formed in the insulating film 45. The counter anode electrode 50ea is made of the same material as that of the counter anode electrode 50ea, for example. The coupling layer 50fa is provided on the insulating film 66 and is coupled to the counter anode electrode 50ea through a through hole formed in the insulating film 66. The coupling layer 50fa is made of the same material as that of the coupling layer 50f, for example. The ultraviolet light emitting part 100UV is provided on the coupling layer 50fa. The configuration of the ultraviolet light emitting part 100UV is the same as that of the inorganic light emitter 100 except the composition for emitting the ultraviolet rays $L_{UV}$. An anode electrode 110UV of the ultraviolet light emitting part 100UV is electrically coupled to the counter anode electrode 50ef via a reflective layer 112UV and the coupling layer 50fa. A cathode electrode 114UV of the ultraviolet light emitting part 100UV is coupled to the counter cathode electrode 90e. The surface layer 5 according to the second modification is made of material decomposed by being irradiated with the ultraviolet rays $L_{UV}$ (e.g., an organic film). The surface layer 5 may be made of dry positive photoresist.

Figure 18:
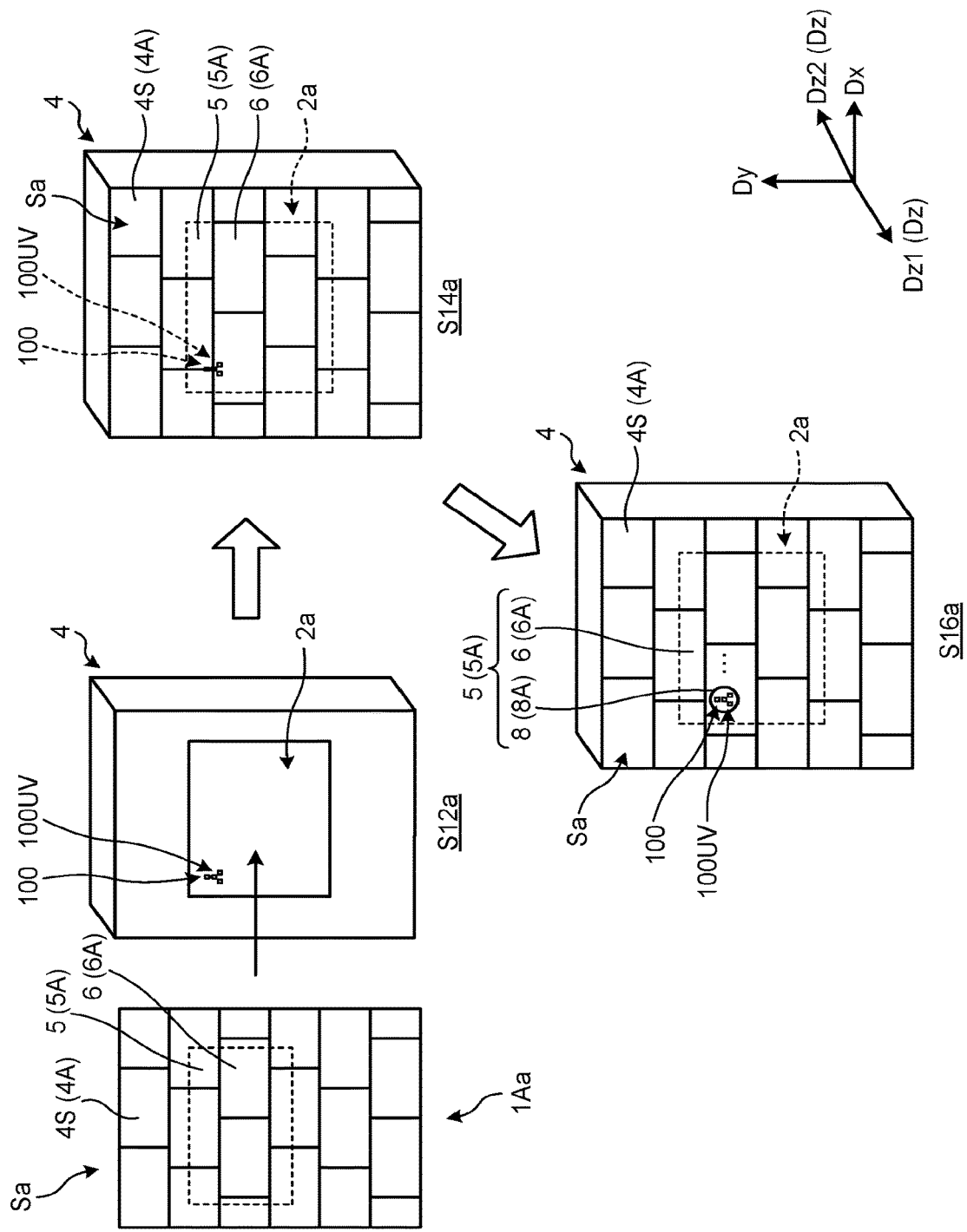
FIG. 18 is a view for explaining a method for assembling a display system according to the second modification.

FIG. 18 is a view for explaining the method for assembling the display system according to the second modification. In the second modification, as illustrated in FIG. 18, a surface part Sa is attached to the surface of the display device 2 having no surface layer 5 attached thereto and the surface of the base 4 having no base surface layer 4S attached thereto as illustrated in Step S12a. The surface part Sa has the same configuration as that of the surface part S according to the embodiment described above except that no transmission part 8 is formed in the surface layer 5. As illustrated in Step S14a, the inorganic light emitters 100 (pixels Pix) of the display device 2 are covered with the surface layer 5 (blocking part 6) of the surface part Sa when the surface part Sa is attached to the display device 2. Subsequently, using a controller, the display device 2 causes the ultraviolet light emitting parts 100UV to emit the ultraviolet rays $L_{UV}$. In the surface layer 5, the parts irradiated with the ultraviolet rays $L_{UV}$ are photo-decomposed. The parts photo-decomposed by the ultraviolet rays $L_{UV}$ serve as the transmission parts 8, and the part not photo-decomposed by the ultraviolet rays $L_{UV}$ remains as the blocking part 6 without any change. The surface layer 5 subjected to irradiation with the ultraviolet rays $L_{UV}$ may be cleaned with solvent or the like, thereby removing the parts photo-decomposed by the ultraviolet rays $L_{UV}$ to form the transmission parts 8. The transmission part 8 formed by the ultraviolet rays $L_{UV}$ from the ultraviolet light emitting part 100UV overlaps the inorganic light emitters 100 (pixel Pix) in planar view because the ultraviolet light emitting part 100UV is provided in the pixel Pix. As described above, the display device 2a includes the ultraviolet light emitting parts 100UV that emit the ultraviolet rays $L_{UV}$ for forming the transmission parts 8 in the surface layer 5. As a result, it is unnecessary to align the transmission parts 8 with the inorganic light emitters 100 (pixels Pix). The ultraviolet light emitting parts 100UV need not be turned on after forming the transmission parts 8. Also in the second modification, the base surface layer 4S and the surface layer 5 may be separate members.

Figure 19:
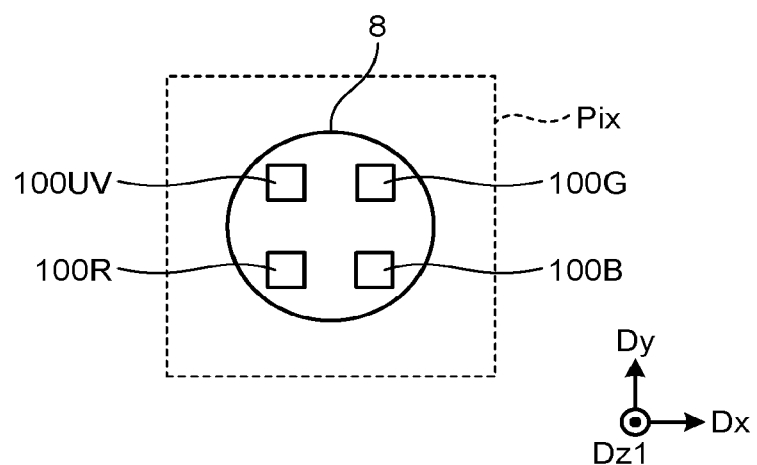
FIG. 19 is a schematic for illustrating another example of the pixel according to the second modification.

While the ultraviolet light emitting part 100UV is positioned at the center of the pixel Pix in planar view in the example illustrated in FIG. 16, the position of the ultraviolet light emitting part 100UV is not limited to the center and may be any desired position. FIG. 19 is a schematic for illustrating another example of the pixel according to the second modification. As illustrated in FIG. 19, for example, the ultraviolet light emitting part 100UV may be provided such that the ultraviolet light emitting part 100UV, the first inorganic light emitter 100R, the second inorganic light emitter 100G, and the third inorganic light emitter 100B are disposed at the respective four vertices of a rectangle. In this case, the ultraviolet light emitting part 100UV may be attached to the display device 2 with inclination such that the ultraviolet rays $L_{UV}$ travel toward the center line of the pixel Pix.

Figure 20:
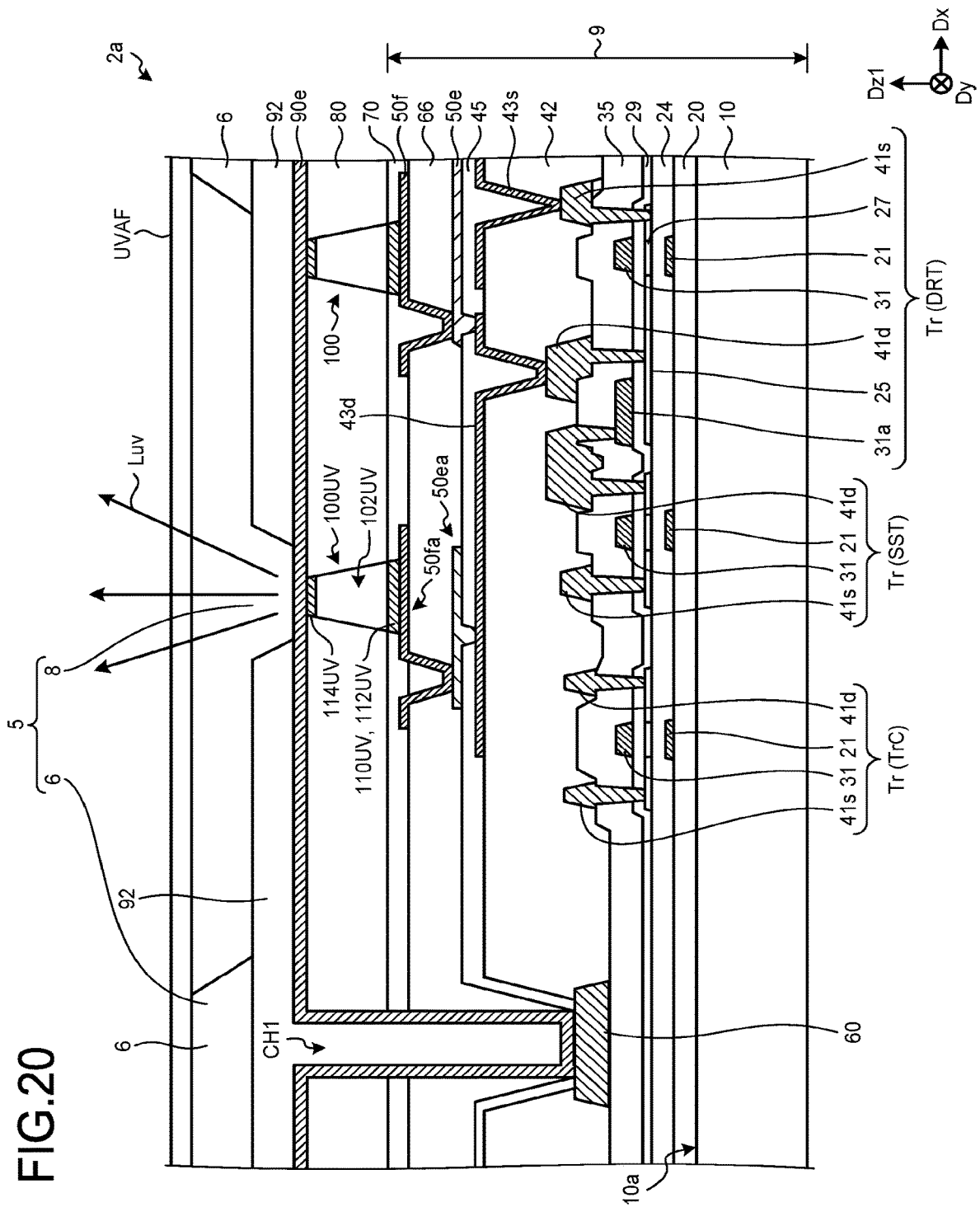
FIG. 20 is a sectional view for illustrating another example of the configuration of the display device according to the second modification.

While the transmission part 8 according to the second modification is an opening, it may be a solid member that allows the light L to pass therethrough. FIG. 20 is a sectional view for illustrating another example of the configuration of the display device according to the second modification. As illustrated in FIG. 20, the display device 2a in this example includes an ultraviolet blocking film UVAF on the surface layer 5. In the configuration illustrated in FIG. 20, the surface layer 5 is an organic film (resin film) containing photo-reactive pigments. The organic film is a transparent film that allows visible light to pass therethrough. The photo-reactive pigments are pigments colored so as to absorb visible light. If the pigments are irradiated with the ultraviolet rays $L_{UV}$, they react to be decomposed. The photo-reactive pigments are azo pigments, for example. When not being irradiated with the ultraviolet rays $L_{UV}$, the surface layer 5 absorbs and blocks visible light in the whole region because the transparent organic film that is the base material is colored with the photo-reactive pigments that is an additive. By contrast, when being irradiated with the ultraviolet rays $L_{UV}$ from the ultraviolet light emitting part 100UV, the photo-reactive pigments at the part irradiated with the ultraviolet rays $L_{UV}$ are decomposed in the surface layer 5. The part in which the photo-reactive pigments are decomposed serves as the transparent transmission part 8, and the part not irradiated with the ultraviolet rays $L_{UV}$ serves as the blocking part 6 in which the photo-reactive pigments remain. The transmission part 8 is not an opening but a solid member including a transparent organic film.

The ultraviolet blocking film UVAF is a film that absorbs ultraviolet rays. The ultraviolet blocking film UVAF absorbs ultraviolet rays traveling from the outside and blocks them from reaching the surface layer 5. The ultraviolet blocking film UVAF blocks ultraviolet rays traveling from the outside to the surface layer 5, thereby preventing the photo-reactive pigments in the blocking part 6 of the surface layer 5 from being decomposed by external ultraviolet rays (e.g., ultraviolet components included in sunlight). The ultraviolet blocking film UVAF is not limited to a member that absorbs ultraviolet rays as long as it prevents ultraviolet rays traveling from the outside of the display device 2 from reaching the surface layer 5. The ultraviolet blocking film UVAF may be a member that reflects ultraviolet rays, for example.

Figure 21:
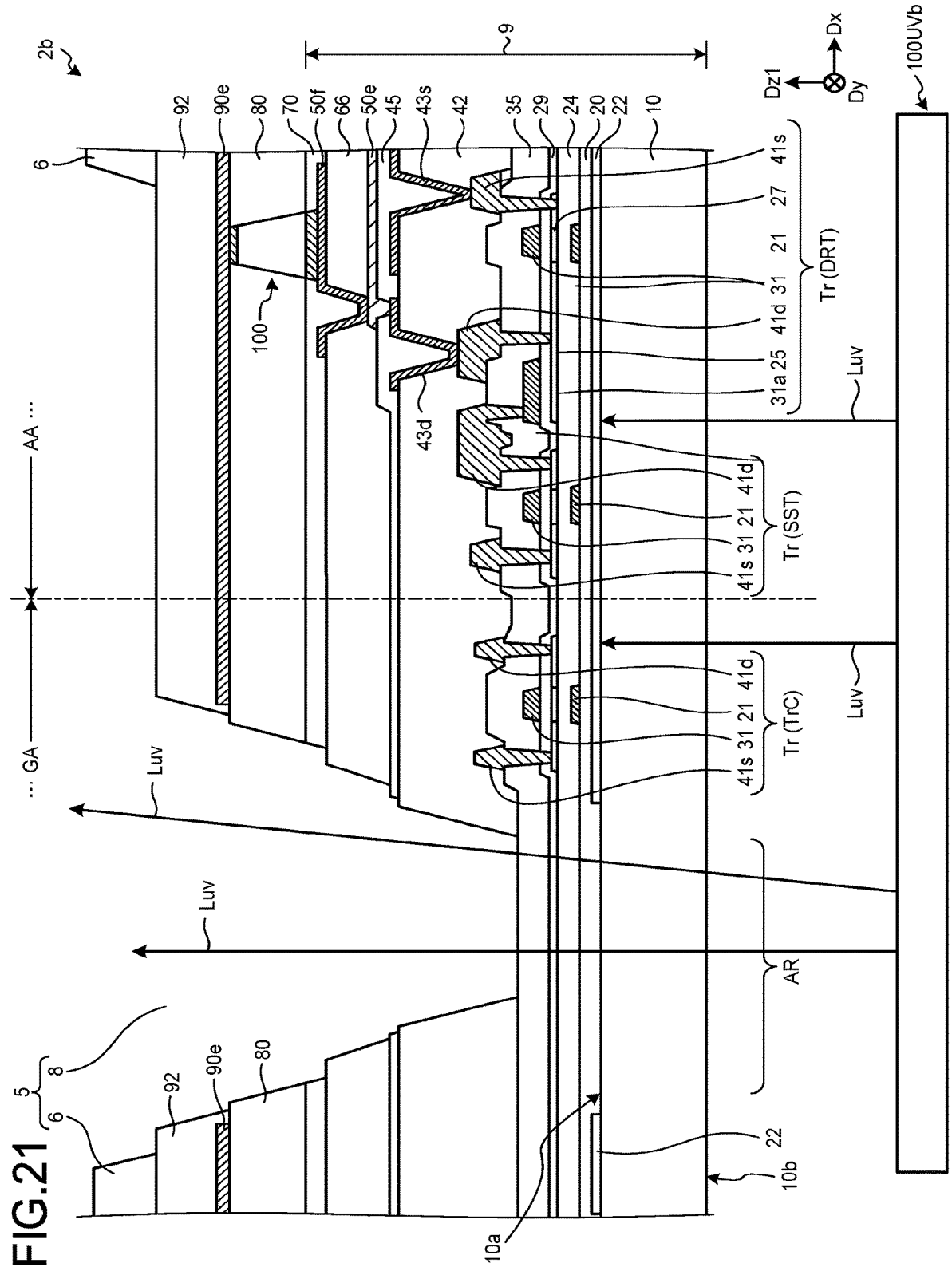
FIG. 21 is a sectional view for illustrating an example of the configuration of a display device according to a third modification.

While the ultraviolet light emitting parts 100UV are provided in the display device 2 in the second modification, an ultraviolet light emitting part 100UVb may be provided outside the display device 2 as described in a third modification below. FIG. 21 is a sectional view for illustrating an example of the configuration of the display device according to the third modification. As illustrated in FIG. 21, a display device 2b according to the third modification is different from the second modification in that it does not include the counter anode electrode 50ea, the coupling layer 50fa, and the ultraviolet light emitting part 100UV inside thereof. The display device 2b does not include the transistors Tr, the inorganic light emitters 100, various electrodes, various kinds of wiring, organic insulating films having low transmittance for ultraviolet rays, and other components in a region AR irradiated with the ultraviolet rays LUV. In the example illustrated in FIG. 21, the region AR is provided with the substrate 10, the undercoat layer 20, and the insulating films 24, 29, and 35. The display device 2b includes a light-blocking layer 22 that blocks light on the first surface 10a of the substrate 10. The light-blocking layer 22 is disposed in the region other than the region AR. The light-blocking layer 22 blocks the ultraviolet rays $L_{UV}$ and is a molybdenum-tungsten alloy film, for example.

In this configuration, the ultraviolet light emitting part 100UVb is disposed on the second surface 10b of the substrate 10. The ultraviolet light emitting part 100UVb may have any desired configuration as long as it is a device that can emit the ultraviolet rays $L_{UV}$. The ultraviolet light emitting part 100UVb emits the ultraviolet rays $L_{UV}$ to the whole region of the display device 2b in planar view from the second surface 10b of the substrate 10. In the ultraviolet rays from the ultraviolet light emitting part 100UVb, the ultraviolet rays $L_{UV}$ are blocked by the light-blocking layer 22 in the region other than the region AR. By contrast, the ultraviolet rays $L_{UV}$ from the ultraviolet light emitting part 100UVb pass through the substrate 10, the undercoat layer 20, and the insulating films 24, 29, and 35 in the region AR and are incident on the surface layer 5. In the surface layer 5, the part irradiated with the ultraviolet rays $L_{UV}$ is decomposed and serves as the transmission part 8, and the part not irradiated with the ultraviolet rays $L_{UV}$ serves as the blocking part 6. In FIG. 21, the surface layer 5 on the upper side of the inorganic light emitter 100 does not seem to be irradiated with the ultraviolet rays $L_{UV}$ because of the layout in the figure. In an actual configuration, however, the position of the region AR is adjusted such that the surface layer 5 on the upper side of the inorganic light emitter 100 is irradiated with the ultraviolet rays $L_{UV}$. As a result, the part on the upper side of the inorganic light emitter 100 serves as the transmission part 8. Similarly to the second modification illustrated in FIG. 20, the third modification may also include the ultraviolet blocking film UVAF, and the transmission part 8 may be a transparent member.

Out of other advantageous effects provided by the aspects described in the present embodiment, advantageous effects clearly defined by the description in the present specification or appropriately conceivable by those skilled in the art are naturally provided by the present disclosure.

What is claimed is:

1. A display system comprising a base and a display device attached to the base, wherein
the display device comprises:
a plurality of inorganic light emitters arrayed in a matrix with a row-column configuration; and
a surface layer provided in a traveling direction of light emitted from the inorganic light emitters with respect to the inorganic light emitters and comprising a plurality of transmission parts and a blocking part, the transmission parts being provided in a matrix with a row-column configuration so as to overlap the inorganic light emitters when viewed from the traveling direction of the light and allowing the light from the inorganic light emitters to pass therethrough, the blocking part blocking the light from the inorganic light emitters, and
the inorganic light emitters are provided overlapping the transmission parts provided to the surface layer,
one of the inorganic light emitters includes an anode electrode, a cathode electrode, and an inorganic light emitting element provided between the anode electrode and the cathode electrode,
the inorganic light emitting element includes an n-type cladding layer, a p-type cladding layer, and a light emission layer provided between the p-type cladding layer and the n-type cladding layer.

2. The display system according to claim 1, wherein
an image displayed by the light from the inorganic light emitters having passed through the transmission parts and a surface of the base are configured to be visually recognized when the inorganic light emitters are turned on, and
a surface of the surface layer and the surface of the base are configured to be visually recognized to seem to continuously extend when the inorganic light emitters are turned off.

3. The display system according to claim 1, wherein the surface layer and a base surface layer that constitutes a surface of the base are an integrated member.

4. The display system according to claim 1, wherein the surface layer and a base surface layer that constitutes a surface of the base are separate members.

5. The display system according to claim 1, further comprising an illuminator configured to emit light to the surface of the surface layer when the inorganic light emitters are turned off and stop emitting the light to the surface of the surface layer when the inorganic light emitters are turned on.

6. The display system according to claim 1, further comprising an ultraviolet light emitting part configured to emit an ultraviolet ray for forming the transmission parts in the surface layer.

7. The display system according to claim 1, wherein a surface of the blocking part and the surface of the base are the same in at least one of shape, pattern, and color.

* * * * *